(12) United States Patent
Nakao

(10) Patent No.: US 6,709,792 B2
(45) Date of Patent: Mar. 23, 2004

(54) METHOD FOR FORMATION OF SEMICONDUCTOR DEVICE PATTERN, METHOD FOR DESIGNING PHOTO MASK PATTERN, PHOTO MASK AND PROCESS FOR PHOTO MASK

(75) Inventor: Shuji Nakao, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/163,554

(22) Filed: Jun. 7, 2002

(65) Prior Publication Data

US 2002/0155395 A1 Oct. 24, 2002

Related U.S. Application Data

(62) Division of application No. 09/782,283, filed on Feb. 14, 2001, now Pat. No. 6,605,411.

(30) Foreign Application Priority Data

Aug. 25, 2000 (JP) ........................................ 2000-255681

(51) Int. Cl.⁷ .............................. G03F 9/00; G03F 7/00
(52) U.S. Cl. ............................. 430/5; 430/30; 430/311
(58) Field of Search ............................................ 430/5

(56) References Cited

U.S. PATENT DOCUMENTS

| | | | |
|---|---|---|---|
| 6,222,241 B1 | 4/2001 | Plat | 257/437 |
| 6,251,546 B1 | 6/2001 | Cirelli et al. | 430/5 |
| 6,316,163 B1 * | 11/2001 | Magoshi et al. | 430/296 |
| 6,335,130 B1 | 1/2002 | Chen et al. | 430/5 |

FOREIGN PATENT DOCUMENTS

| | | |
|---|---|---|
| JP | 5-335213 | 12/1993 |
| JP | 11-8179 | 1/1999 |

OTHER PUBLICATIONS

"Optics for Photolithography" B.W.Smith Microlithography–Science and Technology; eds: J.R.Sheats and B.W. Smith, Marcel Dekker,NY,(1998), pp. 171–271.*
"Optics for Photolithography", Bruce W. Smith, *Microlithography Science & Technology*,1998, pp. 171–270.
"The Application of Alternating Phase–shifting Masks to 140 mm Gate Patterning(II): Mask Design and Manufacturing Tolerances", Hua–Yu Liu, *SPIE*, vol. 3334, 1998, pp. 2–14.

* cited by examiner

*Primary Examiner*—Mark F. Huff
*Assistant Examiner*—Kripa Sagar
(74) *Attorney, Agent, or Firm*—McDermott, Will & Emery

(57) ABSTRACT

A shielding film is formed on the surface of a substrate and a pair of aperture patterns for light transmission with substantially the same line width are formed in the above shielding film so as to run parallel to each other with a gap and to be isolated from other aperture patterns for light transmission. The exposure amount (exposure energy to sufficiently large aperture pattern) at the time a photoresist is exposed by using this photo mask is 4 or more times and 20 or less times as large as the exposure amount on the border where the photoresist is converted from soluble to insoluble through the exposure or the exposure amount on the border from insoluble to soluble. Thereby, it becomes possible to form a microscopic pattern without using an auxiliary pattern method or a phase shift mask and the default inspection of a mask can be made easy.

1 Claim, 36 Drawing Sheets

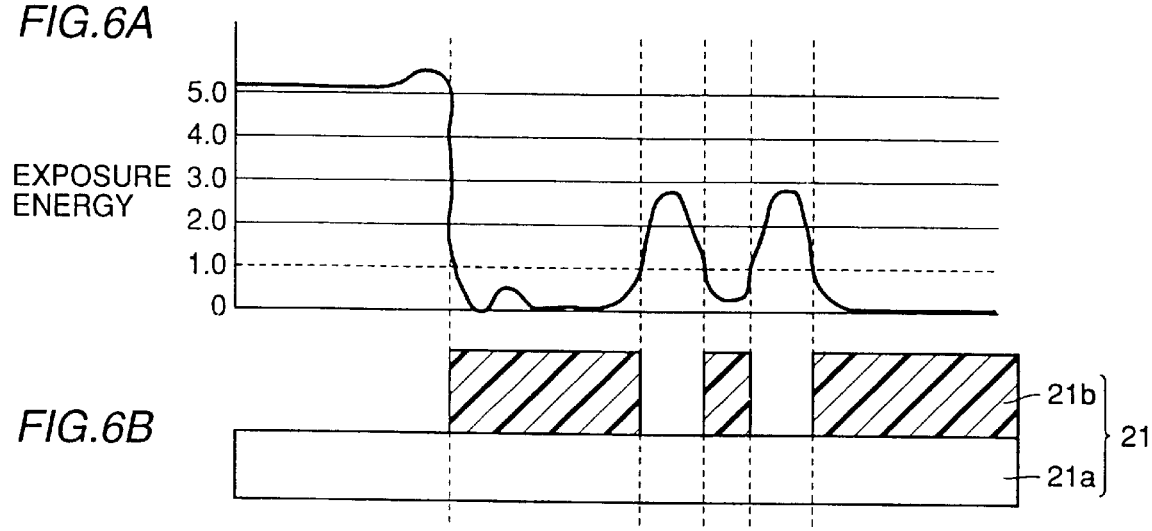

METHOD FOR FORMATION OF SEMICONDUCTOR DEVICE PATTERN, METHOD FOR DESIGNING PHOTO MASK PATTERN, PHOTO MASK AND PROCESS FOR PHOTO MASK

This application is a divisional of application Ser. No. 09/782,283 filed Feb. 14, 2001 now U.S. Pat. No. 6,605,411.

BACKGROUND OF THE INVENTION

1. Field of the Invention

The present invention relates to a method for formation of a semiconductor device pattern, a method for designing a photo mask pattern, a photo mask and a process for a photo mask, in particular, to a method for formation of a semiconductor device pattern, a method for designing a photo mask pattern, a photo mask and a process for a photo mask by means of photolithographic technology for forming a microscopic pattern in a semiconductor device.

2. Description of the Background Art

In recent years semiconductor integration circuits have been achieved remarkably high levels of integration and miniaturization. Accompanying that, miniaturization of circuit patterns formed on a semiconductor substrate (hereinafter referred to simply as a wafer) has made rapid advances.

Above all, photolithographic technology is widely perceived as the basic technology in pattern formation. Accordingly, up until the present day a variety of developments and improvements have been achieved. However, the miniaturization of patterning shows no signs of abating and the requirements for the increase of resolution of patterns have become more stringent.

This photolithographic technology is a technology wherein a pattern of a photo mask (original layout) is copied onto the photoresist applied to a wafer so that the copied photoresist is used to pattern the lower layer film to be etched.

At the time of copying of this photoresist, development processing is applied to the photoresist and the type where the part of the photoresist to which light hits is removed through this development processing is called a positive type photoresist while the type where the part of the photoresist to which light does not hit is eliminated is called a negative type photoresist.

In general, a resolution limit R (nm) in photolithographic technology using a scaling down exposure method is represented as:

$$R = k_1 \cdot \lambda / (NA)$$

Here, the wavelength (nm) of the utilized light is denoted as $\lambda$, numerical aperture of a projection optical system of the lens is denoted as NA and a constant depending on the resist process is denoted as $k_1$.

As is known from the above equation, in order to increase the resolution limit R, that is to say, in order to gain an even smaller pattern a method for making the values of $k_1$ and $\lambda$ smaller while making the value of NA larger should be considered. That is to say, the constant depending on the resist process should be made smaller while proceeding to make the wavelength shorter and to make NA higher.

However, improvement of the light source or lenses are technically difficult and a problem arises, on the contrary, in proceeding to make the wavelength shorter and the NA higher so that the focal point depth $\delta (\delta = k_2 \cdot \lambda / (NA^2))$ of light becomes shallower so as to induce the lowering of the resolution.

Under such circumstances, in manufacturing semiconductor integrated circuits it is necessary to form a microscopic pattern with a large process margin. A modified illumination method works effectively for formation of a concentrated pattern and is widely practiced. On the other hand, as for a method for formation of an isolated line pattern with a large process margin, there is the method of using a Levenson type phase shift mask.

However, in the case of the Levenson type phase shift mask, it is necessary to manufacture a phase shifter for converting the phase of the exposure light by 180° and there is the problem that the mask is difficult to manufacture. In addition, since the Levenson type phase shift mask attempts to increase the resolution by positively interfering with the transmission light of different phases, there is the problem that lens aberration of the projection exposure apparatus influences the resolution so that the excellent characteristics which are supposed to be gained in the case of no aberration cannot be gained. Therefore, the method of using the Levenson type phase shift mask is in the condition where the practical use thereof hasn't made progress.

In addition, a method for improving the process margin (so-called auxiliary pattern method) by arranging the lines of a line width which is not resolved on the mask along the originally patterned lines has been taken into consideration. However, in this method the dimension of the mask pattern becomes extremely small and there is a problem that inspection for defects of the mask is difficult.

SUMMARY OF THE INVENTION

The purpose of the present invention is to provide a method for the formation of a semiconductor device pattern, a method for designing a photo mask pattern, a photo mask and a process for a photo mask wherein it is possible to form a microscopic pattern without using an auxiliary pattern method, a phase shift mask or the like and wherein the defect inspection of a mask is easy.

A method for a semiconductor device pattern formation according to the present invention includes a first exposure step of exposing a first photoresist on a wafer surface by a projection exposure method through a first photo mask which has an aperture pattern for light transmission including a pair of lines with substantially same width which run parallel to each other with a gap and which are isolated from other aperture patterns for light transmission, and an exposure amount, defined by an energy given to the pattern which has a sufficiently large mask aperture when the first photoresist is exposed, is four or more times and twenty or less times as large as the exposure amount on the border where the first photoresist is converted from soluble to insoluble in a developer through exposure or the exposure amount on the border where the first photoresist is converted from insoluble to soluble in a developer through exposure.

According to a method for the formation of a semiconductor device pattern, the first photoresist is exposed through a so-called overexposure wherein the exposure amount is larger than an ordinary exposure via the first photo mask which has a pair of aperture patterns for light transmission. Thereby, a microscopic pattern can be formed wherein the fluctuation of the pattern dimension is small even when the focus is changed to a certain degree. In addition, the depth of focus (DOF), which is a focal range wherein a certain focusing performance can be maintained at a constant level, can be made large. Therefore, a microscopic pattern can be formed with a large process margin and with a high precision without using an auxiliary pattern method of a phase shift mask.

The above described method for a semiconductor device pattern formation preferably further includes a second exposure step wherein regions of the first photoresist corresponding to regions other than pairs of aperture patterns for light transmission are exposed after the first exposure step and before the development step of the first photoresist.

A complicated pattern can be dealt with by carrying out a double exposure in the above manner.

In the above described method for a semiconductor device pattern formation, the first exposure is preferably carried out by modified illumination.

Thereby, the resolution and the depth of focus can be further increased.

In the above described method for a semiconductor device pattern formation, the modified illumination is preferably carried out by using a ring band illumination stop in the illumination optical system.

Thereby, the resolution and the depth of focus can be increased.

In the above described method for a semiconductor device pattern formation, the modified illumination is preferably carried out by using a quadruple polar illumination stop in the illumination optical system.

Thereby, the resolution and the depth of focus can be increased.

In the above described method for a semiconductor device pattern formation, the first photo mask is preferably an attenuating phase shift mask including a semi-transmissive shielding film having the pair of aperture patterns for light transmission. The semi-transmissive shielding film includes a material which shifts the phase of exposure light after transmitting the semi-transmissive shielding film so as to be a phase which is different by 180 degrees from the phase of exposure light after transmitting the pair of aperture patterns for light transmission and which makes the intensity of exposure light after transmitting the semi-transmissive shielding film smaller than the intensity of exposure light after transmitting the pair of aperture patterns for light transmission.

Processing limit can be further enhanced by using an attenuating phase shift mask in the above manner.

In the above described method for a semiconductor device pattern formation, a transmittance of exposure light of the semi-transmissive shielding film is preferably 2% or more and 10% or less.

Thereby, the effect of the phase shift mask can be exercised efficiently.

In addition, in the case that the transmission light of the exposure light of the semi-transmissive shielding film is less than 2% the intensity of the exposure light which has transmitted the semi-transmissive shielding film becomes too small so that the effect of the attenuating phase shift mask can't be efficiently gained. In addition, in the case that the transmission of the exposure light of the semi-transmissive shielding film exceeds 10% the film thickness of the photoresist after the development by exposure light which has transmitted the semi-transmissive shielding film becomes 0 or is reduced so that the photoresist can't be used an etching mask.

In the above described method for a semiconductor device pattern formation, in an exposure using a ring band illumination stop, a ratio (a/R) of a sine a of a maximum incident angle to the first photo mask of illumination light formed by an illumination optical system to a sine R of a maximum incident light beam angle in an image on a wafer by a projection optical system multiplied by a scaling down magnification r of the projection optical system (r×a/R) is preferably 0.6 or more and 0.9 or less.

Thereby, an excellent resolution can be gained.

In the above described method for a semiconductor device pattern formation, in an exposure using a ring band illumination stop, a sine b of a minimum incident angle to the first photo mask of illumination light formed by an illumination optical system is preferably ½ or more of the sine a of the maximum incident angle.

Thereby, an excellent resolution can be gained.

In the above described method for a semiconductor device pattern formation, in an exposure using a quadruple polar illumination stop, a ratio (a/R) of a sine a of a maximum incident angle to the first photo mask of illumination light formed by an illumination optical system to a sine R of a maximum incident light beam angle in an image on a wafer by a projection optical system multiplied by a scaling down magnification r of the projection optical system (r×a/R) is preferably 0.6 or more and 0.9 or less.

Thereby, an excellent resolution can be gained.

In the above described method for a semiconductor device pattern formation, in an exposure using a quadruple polar illumination stop, a ratio (b/R) of a sine b of a minimum incident angle to the first photo mask of illumination light formed by an illumination optical system to a sine R of a maximum incident light beam angle in an image on a wafer by a projection optical system multiplied by a scaling down magnification r of the projection optical system (r×b/R) is preferably 0.3 or more.

Thereby, an excellent resolution can be gained.

In the above described method for a semiconductor device pattern formation, a line width WI of each of the pair of aperture patterns for light transmission preferably satisfies the relationship of $0.35 < W1/(\lambda/\text{VNA}) < 0.65$ when a wavelength of exposure light is denoted as $\lambda$ and numerical aperture of the projection optical system is denoted as NA.

In an aperture pattern for light transmission with such a line width, a microscopic pattern can be formed with a large process margin and with a high precision.

In the above described method for a semiconductor device pattern formation, a gap W2 of the pair of aperture patterns for light transmission preferably satisfies the relationship of $0.35 < W2/(\lambda/NA)$ when a wavelength of exposure light is denoted as $\lambda$ and numerical aperture of the projection optical system is denoted as NA.

In an aperture pattern for light transmission with such a line width, a microscopic pattern can be formed with a large process margin and with a high precision.

In the above described method for a semiconductor device pattern formation, a gap W3 between the pair of aperture patterns for light transmission and the other aperture patterns for light transmission preferably satisfies the relationship of $0.70 < W3/(\lambda/NA)$.

By maintaining the gap W3 with other aperture patterns for light transmission in this manner, a microscopic pattern can be formed with a large process margin and with a high precision.

In the above described method for a semiconductor device pattern formation, a length L of each of said pair of aperture patterns for light transmission preferably satisfies the relationship of $1.3 < L/(\lambda/NA)$.

In the aperture patterns for light transmission of such a length L, a microscopic pattern can be formed with a large process margin and with a high precision.

The above described method for a semiconductor device pattern formation includes: the step of patterning by developing the exposed first photoresist; the step of processing a first film to be processed under the first photoresist using the patterned first photoresist as a mask; the step of applying a second photoresist after the first photoresist is removed; the step of a second exposure for exposing a region of the second photoresist which correspond other regions except regions sandwiched between the pair of lines of the aperture pattern for light transmission; the step of patterning by developing the exposed second photoresist; and the step of processing the first film to be processed under the second photoresist using the patterned second photoresist as a mask.

Thereby, a complicated microscopic pattern can be copied to the film to be processed with a high precision.

The above described method for a semiconductor device pattern formation preferably further includes the step of patterning a second film to be processed below the first film to be processed using, as a mask, the first film to be processed which has been processed by using, as a photo mask, the first and the second layers of photoresist.

Thereby, by using the film to be processed as a hard mask the layer below it can be patterned.

In the above described method for the formation of a semiconductor device pattern, the material of the first film to be processed includes a silicon oxidation film and the material of the second film to be processed includes a polycrystal silicon.

The materials of the first and the second films to be processed can be selected in this manner.

In the above described method for the formation of a semiconductor device pattern, the first exposure is, preferably, carried out a plurality of times before the first photoresist is developed.

Thereby, a complicated pattern can be dealt with.

In the above described method for the formation of a semiconductor device pattern, the second exposure is, preferably, carried out a plurality of times before the second photoresist is developed.

Thereby, a complicated pattern can be dealt with.

A method for designing a photo mask pattern according to the present invention includes the following steps.

First, figure parts of microscopic line pattern is extracted from a design pattern layout. And the line width W2 of the mask dark lines in the figure parts of microscopic line pattern is adjusted so as to satisfy the relationship of $0.35 < W2/(\lambda/NA)$, wherein the wave length of exposure light is denoted as $\lambda$ and the numerical aperture of the projection exposure system is denoted as NA. Then a pair of aperture patterns for light transmission which have the line width of W1 satisfying the relationship of $0.35 < W1/(\lambda/NA) < 0.65$ are arranged so as to sandwich the mask dark lines of the line width W2.

Thereby, it becomes possible to design a photo mask pattern which can form a microscopic pattern with a large process margin and with a high precision.

In accordance with a process for a photo mask according to the present invention, a photo mask having, at least as a part of the entire pattern the pair of aperture patterns for light transmission based on the line widths W1 and W2, calculated out by the above described method for designing a photo mask pattern, is produced.

Thereby, a photo mask which has the above described mask pattern can be processed.

A photo mask according to the present invention comprises a substrate and a shielding film. The substrate has a main surface. The shielding film is formed on the main surface of the substrate and has a pair of aperture patterns for light transmission with substantially the same line width which run parallel to each other for the gap and are isolated from other aperture patterns for light transmission. When the line width of the pair of aperture patterns for light transmission is denoted as W1, the gap between the pair of aperture patterns for light transmission is denoted as W2, and the minimum gap between the pair of the aperture patterns for light transmission and other aperture patterns for light transmission is denoted as W3, each of W1, W2 and W3 satisfies the relationships of $0.54 < W2/W1$ and $1.08 < W3/W1$.

Thereby, a photo mask which can form a microscopic pattern with a large process margin and a high precision can be gained.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 6A and 6B are views showing the relationship between the exposure energy distribution and the resist pattern in the case that the exposure energy is large;

DESCRIPTION OF THE PREFERRED EMBODIMENTS

In the following, the embodiments of the present invention are described in reference to the drawings.

(First Embodiment)

Figure 1:
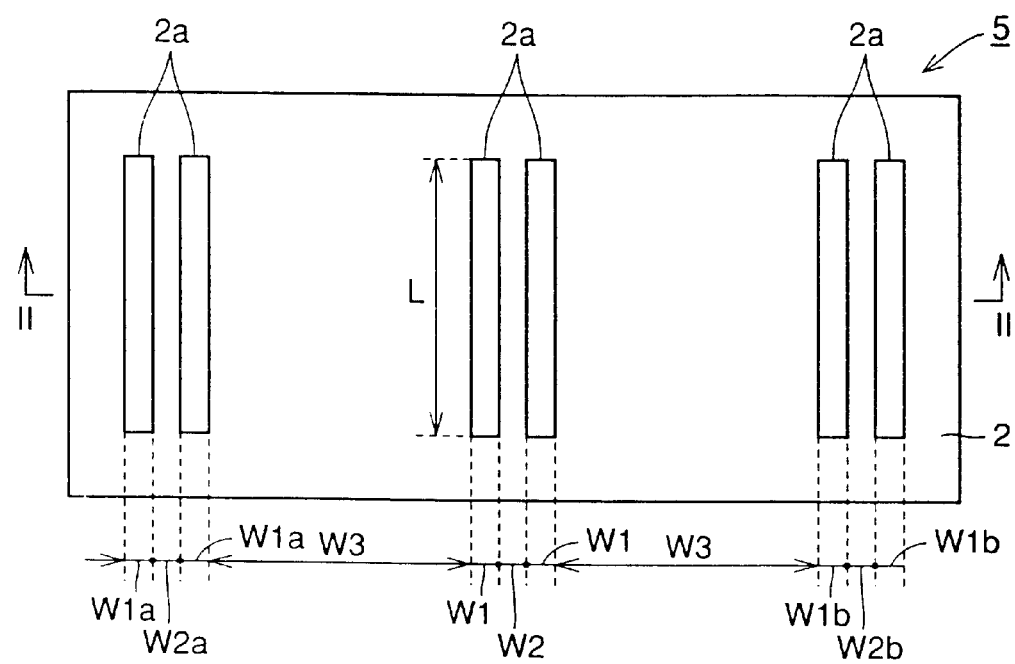
FIG. 1 is a plan view which schematically shows a structure of a photo mask according to the first embodiment of the present invention.
Figure 2:
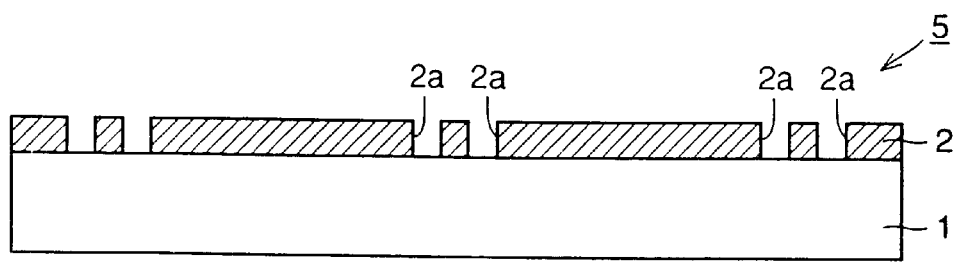
FIG. 2 is a schematic cross section view alone line II—II of FIG. 1.

Referring to FIGS. 1 and 2, a photo mask 5 of the present embodiment has a transparent substrate 1 including, for example, crystal and a shielding film 2 including, for example, chromium. The shielding film 2 has an aperture pattern 2a for light transmission of a pair of lines of substantially the same line width W1 which are formed so as to run in parallel to each other with a gap W2 in the center of the figure.

In addition, the shielding film 2 may have not only this pattern but also an aperture pattern 2a for light transmission of a pair of lines of substantially the same line width W1a which are formed so as to run in parallel to each other with a gap W2a on the left in the figure, an aperture pattern 2b for light transmission of a pair of lines of substantially the same line width W1b which are formed so as to run parallel to each other with a gap W2b on the right in the figure, or the like.

Each of these pairs of aperture patterns 2a for light transmission has a wide gap W3 with, and is isolated from, other aperture patterns 2a for light transmission.

The line width W1 (or W1a, W1b) of the aperture pattern 2a for light transmission, the gap W2 of the pair of the aperture patterns 2a for light transmission and the gap W3 between an aperture pattern 2a for light transmission and another aperture pattern 2a for light transmission satisfy the relationships of $0.54 < W2/W1$ and $1.08 < W3/W1$, respectively.

The line width W1 (or W1a, W1b) of each of the pairs of aperture patterns 2a for light transmission also satisfies the relationship of $0.35 < W1/(\lambda/NA) < 0.65$ when the wave length of the exposure light at the time of exposing is denoted as $\lambda$ and the numerical aperture of the projection optical system is denoted as NA. And the gap W2 (or W2a, W2b) of the pair of aperture patterns 2a for light transmission satisfies the relationship of 0.35<W2/($\lambda$/NA) while the gap W3 between a pair of aperture patterns 2a for light transmission and other aperture patterns 2a for light transmission satisfies the relationship of 0.70<W3/($\lambda$/NA).

The length L of each of the pairs of the aperture patterns 2a for light transmission satisfies the relationship of 1.3<L/($\lambda$/NA).

Here, the line widths W1a and W1b of the pairs of aperture patterns 2a for light transmission on the right and the left in the figure may have the same dimension as, or a different dimension from, the line width W1 of the pair of aperture patterns 2a for light transmission in the center. Here, it is necessary for both of these line widths W1a and W1b to satisfy the relationship of 0.35<W1/($\lambda$/NA <0.65. And the line widths W1a and W1b may have the same dimension, or different dimensions, with each other as long as the above described relationship is satisfied.

In addition, the gaps W2a and W2b of the pair of the aperture patterns 2a for light transmission on the right and on the left in the figure may have the same dimension as, or a different dimension from, the gap W2 of the pair of the aperture patterns 2a for light transmission in the center. Here, both of these gaps W2a and W2b need to satisfy the relationship of 0.35<W2/($\lambda$/NA). In addition, the gaps W1a and W1b may have the same dimension, or different dimensions, with each other as long as the above described relationship is satisfied.

Here, the gap W3 of the pair of the aperture patterns 2a for light transmission in the center and on the left of the figure and the gap W3 of the pair of the aperture patterns 2a for light transmission in the center and on the right of the figure may have the same dimension, or different dimensions, as each other as long as the relationship of 0.70<W3/($\lambda$/NA) is satisfied.

In addition, the length L of each pair of the aperture patterns 2a for light transmission in the center, on the left and on the right in the figure may have the same dimension with each other or may have different dimensions. Here, all of these length L need to satisfy the relationship of 1.3<L/($\lambda$/NA).

Next, a method for formation of a semiconductor device pattern using a photo mask as shown in FIGS. 1 and 2 is described.

Figure 3:
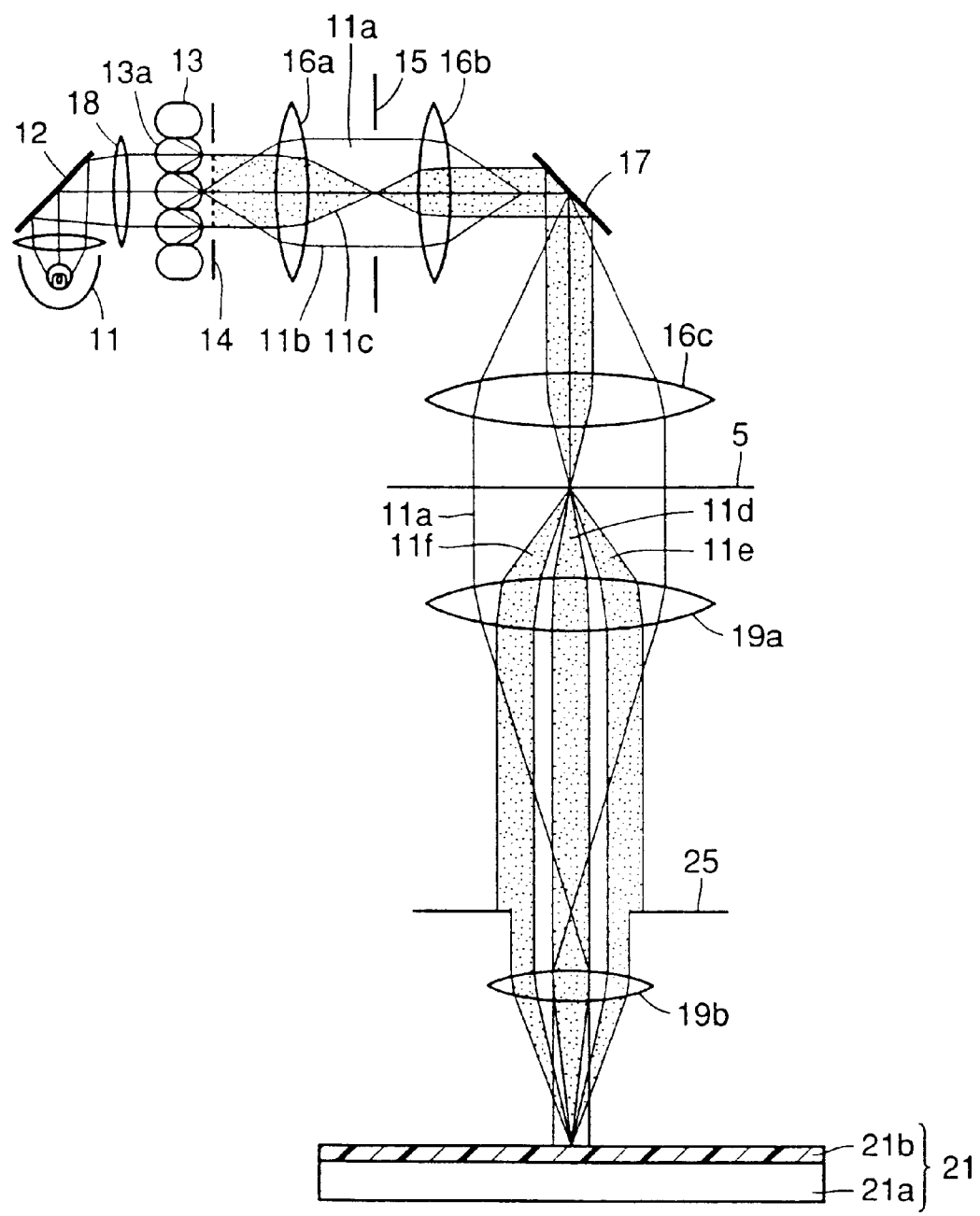
FIG. 3 is a view for describing a method for a pattern formation of a semiconductor device using the photo mask according to the first embodiment of the present invention.

Referring to FIG. 3, this projection exposure apparatus scales down the pattern on the photo mask so as to be projected onto the photoresist 21b on the wafer 21 surface. And the projection exposure apparatus has an illumination optical system from the light source 11 to the pattern of the photo mask 5 and a projection optical system from the pattern of the photo mask 5 to the wafer 21.

The illumination optical system has a mercury lamp 11 which is the light source, a reflecting mirror 12, a condensing lens 18, a fly eye lens 13, a stop 14, condensing lenses 16a, 16b, 16c, a blind stop 15 and a reflecting mirror 17. And the projection optical system has telescopic lenses 19a, 19b and an iris 25.

In the exposure operation, first, light 11a emitted from the mercury lamp 11 is reflected by the reflecting mirror 12, for example, only in the g-line (wave length: 436 nm) so as to be light of a single wave length. Next, light 11a passes through the condensing lens 18 and enters each of the lenses 13a forming each of the fly eyes of the fly eye lens 13 and then passes through the stop 14.

Here, light 11b indicates a light path created by one of the lenses 13a forming a fly eye while light 11c indicates a light path created by the fly eye lens 13.

Light 11a which has passed through the stop 14 passes through the condensing lens 16a, the blind stop 15 and the condensing lens 16b and is reflected by the reflecting mirror 17 at a predetermined angle.

Light 11a reflected by the reflecting mirror 17 transmits through the condensing lens 16c and after that illuminates uniformly the entire surface of the photo mask 5 wherein a predetermined pattern is formed. After that, light 11a is scaled down according to a predetermined magnification by projection lenses 19a and 19b so as to expose the photoresist 21b on the semiconductor substrate 21a.

In the present embodiment, the above exposure is carried out as an overexposure. That is to say, the exposure amount at the time of exposing the photoresist 21b made to be four or more times and twenty or less times as large as the exposure amount on the border where the photoresist 21b is converted from soluble to insoluble in the developer by the exposure or on the border where it is converted from insoluble to soluble. Here, in an ordinary exposure, the exposure amount is 2.5 or more times and 3.5 or less times as large as the exposure amount on the border.

The photoresist 21b which has been exposed in this manner is patterned through development. In this development, in the case that the photoresist 21b is the positive type, only the photoresist in the parts where an exposure energy of a predetermined value or more is entered is removed while in the case of the negative type, only the parts where an exposure energy of a predetermined value or less is inputted are removed. In this manner, the pattern of the photoresist 21b is formed.

After that, the film to be processed is patterned by carrying out the processing such as etching on the film to be processed which is the lower layer of the photoresist 21b using the pattern thereof as a mask.

Next, the intensity of the exposure light defined in the above is described.

Figure 4A:
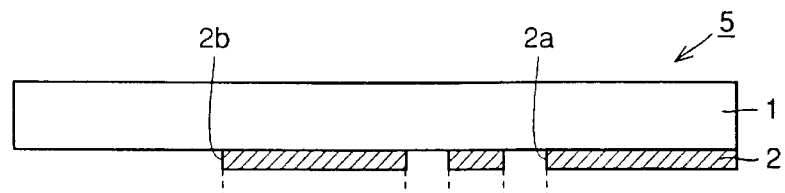
FIGS. 4A and 4B are views showing the relationship between the pattern of the photo mask and the relative optical image intensity distribution.
Figure 4B:
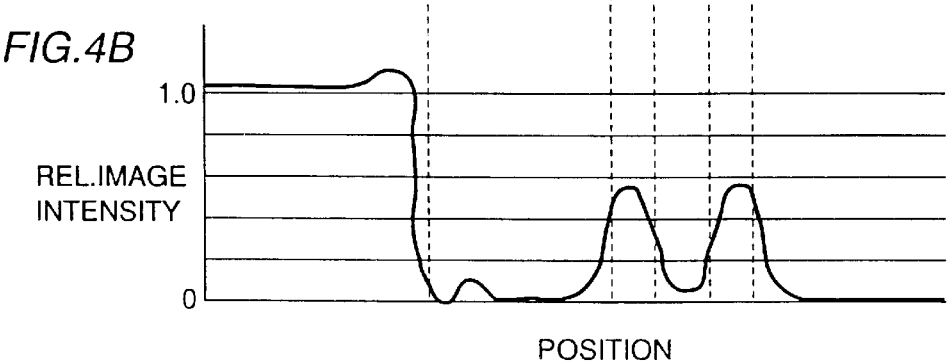

For example, the relative light intensity distribution of the exposure light which has passed through the photo mask 5 as shown in FIG. 4A is shown in FIG. 4B. That is to say, the light intensity of the exposure light which has transmitted through a sufficiently large aperture pattern 2b becomes the highest while the light intensity of the exposure light which has transmitted through a pair of the aperture parts 2a becomes smaller than that.

Figure 5A:
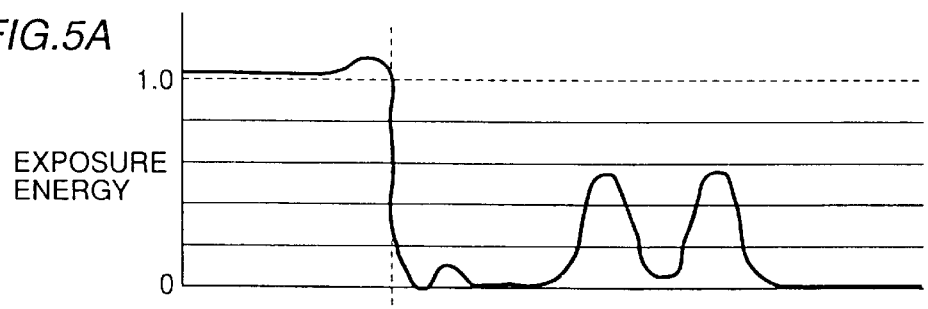
FIGS. 5A and 5B are views showing the relationship between the exposure energy distribution and the resist pattern in the case that the exposure energy is small.
Figure 5B:
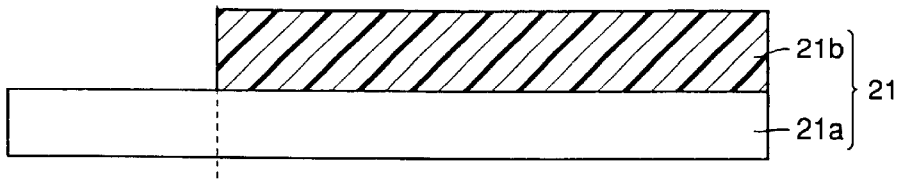

Here, as shown in FIG. 5A, in the case that the exposure light energy inputted into the photoresist for a sufficiently large aperture pattern 2b becomes the exposure energy (here, assumed to be 1.0) on the above border, only the photoresist 21b in the parts corresponding to the aperture pattern 2b is removed as shown in FIG. 5B and no pattern is gained corresponding to the pair of aperture patterns 2a.

Thus, as shown in FIG. 6A, by making the exposure energy inputted into the photoresist for a sufficiently large aperture pattern, for example, five times as large as the exposure energy inputted into the photoresist for a sufficiently large aperture pattern in FIGS. 5A and 5B, the exposure energy inputted into the photoresist through the transmission light of the pair of the aperture patterns 2a can be made larger than the exposure energy (here, assumed to be 1.0) on the border. Thereby, a pattern corresponding to the pair of the aperture patterns 2a can be formed in the photoresist 21b as shown in FIG. 6B.

That is to say, the above exposure energy means that the exposure energy given to the corresponding pattern on the wafer by the exposure light which has transmitted through the sufficiently large aperture 2b of the photo mask 5 becomes four or more times or twenty or less times as large as the exposure energy on the border where the photoresist 21b is converted from soluble to insoluble in the developer or on the border where it is converted from insoluble to soluble.

Figure 7:
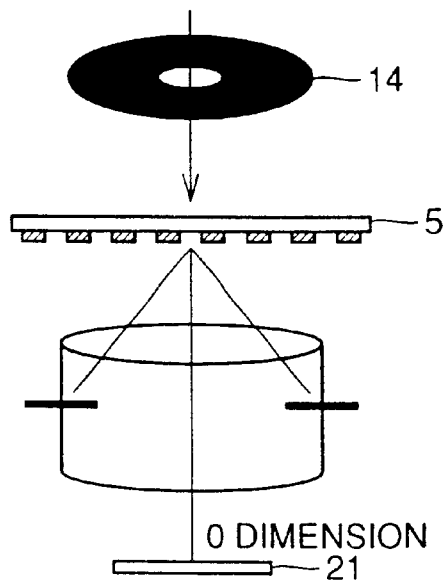
FIG. 7 is a view for describing an ordinary illumination.

In this pattern formation method, though the exposure may be carried out by an ordinary illumination, it is preferable to be carried out by a modified illumination. In the case of an ordinary illumination, as shown in FIG. 7, an exposure light is vertically irradiated to the photo mask 5 so as to expose the wafer 21 by the three light fluxes of 0 dimensional light and ±dimensional light. However, when the pattern of the photo mask 5 becomes microscopic the diffraction angle becomes large and therefore there is a risk that the ±1 dimensional light does not enter into the lens through the vertical illumination so as not to resolve.

Figure 8:
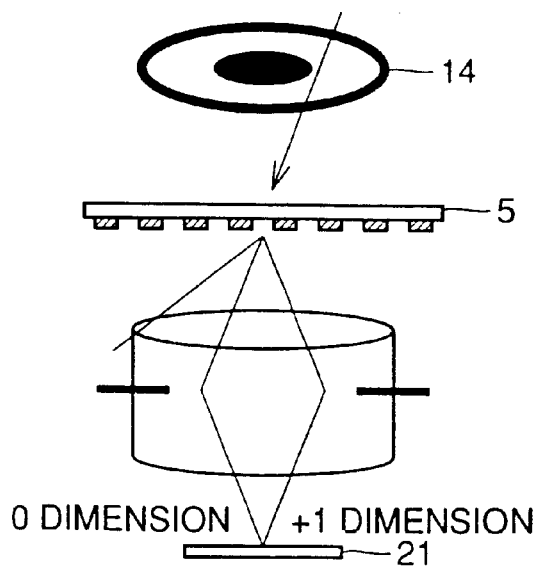
FIG. 8 is a view for describing a modified illumination.

Therefore, an illumination light flux is entered diagonally to the photo mask 5 by a modified illumination as shown in FIG. 8. Thereby, the exposure can be carried out by only two light fluxes of the 0 dimensional light and +1 dimensional or −1 dimensional light which have been diffracted by the photo mask 5 so as to be able to gain the resolution.

Figure 9:
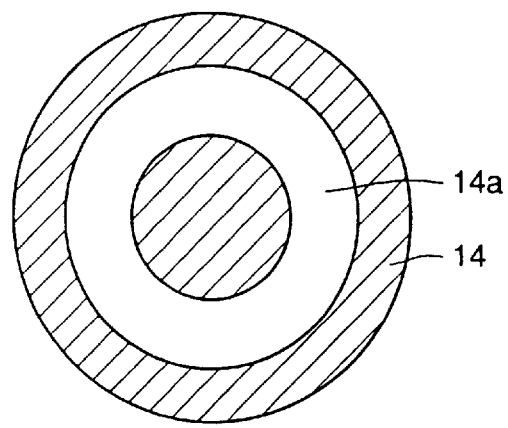
FIG. 9 is a plan view showing a structure of a ring band illumination stop.
Figure 10:
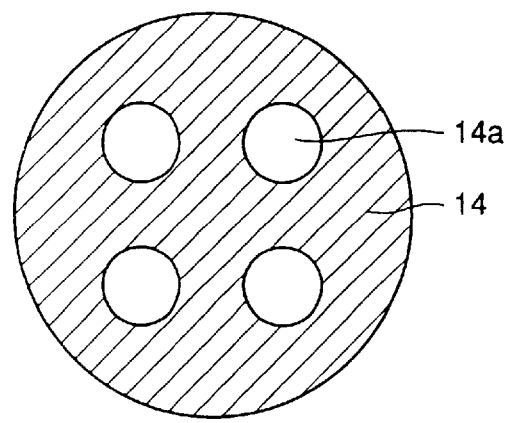
FIG. 10 is a plan view showing a structure of a quadruple polar illumination stop.
Figure 11:
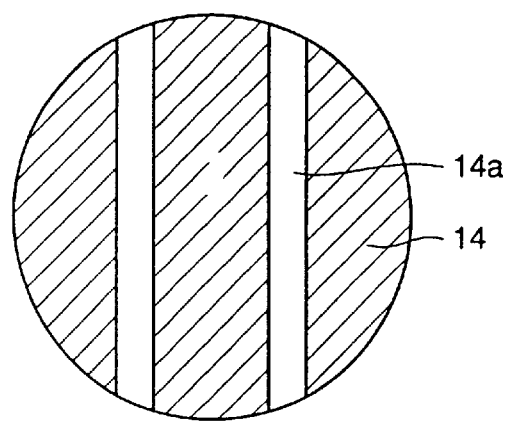
FIG. 11 is a plan view showing a structure of a double polar illumination stop.

As for the stop 14 which is used for this modified illumination, a ring band illumination stop which has a transmission part 14a in a ring shape as shown in FIG. 9 or a quadruple polar illumination stop which has four transmission parts 14a as shown in FIG. 10 may be used. In addition, a double polar illumination stop which has two transmission parts 14a as shown in FIG. 11 may be used.

Figure 12A:
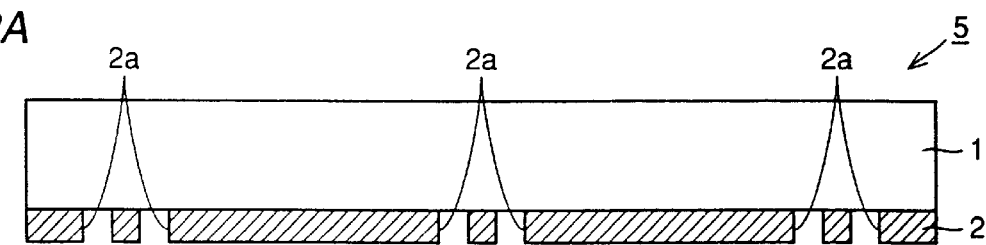
FIG. 12A is a view showing a structure in the case the photo mask is made to be an attenuating phase shift mask and FIG. 12B is a view showing the intensity distribution of transmission light according to the first embodiment of the present invention.

In addition, the photo mask 5 as shown in FIGS. 1 and 2 may be an attenuating phase shift mask as shown in FIG. 12A. In this case, instead of the shielding film 2, a semi-transmissive shielding film 2 which allows the exposure light to transmit to a certain degree is used. This semi-transmissive shielding film 2 has a function of a phase shifter so that the phase of the exposure light after transmitting through the semi-transmissive shielding film 2 becomes a phase which is different, by substantially 180 degree, from the phase of the exposure light after transmitting through the aperture pattern 2a for light transmission as well as a function of attenuating the exposure light so that the intensity of the exposure light after transmitting through the semi-transmissive shielding film 2 becomes lower than the intensity of the exposure light after transmitting through the aperture pattern 2a for light transmission. It is preferable for the transmittance of the exposure light of this semi-transmissive shielding film 2 to be 2% or more and 10% or less.

Figure 12B:
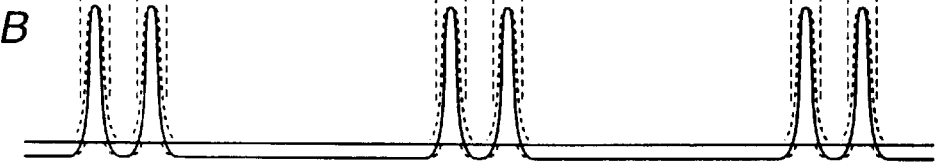

Thereby, as shown in FIG. 12B, lights in the opposite phases overlap on the border between the aperture pattern 2a for light transmission and the shielding part so that the lights are mutually canceled so as to be able to make the light intensity smaller at the edge of the exposure pattern and it becomes possible to enhance the resolution of the pattern image.

Figure 13:
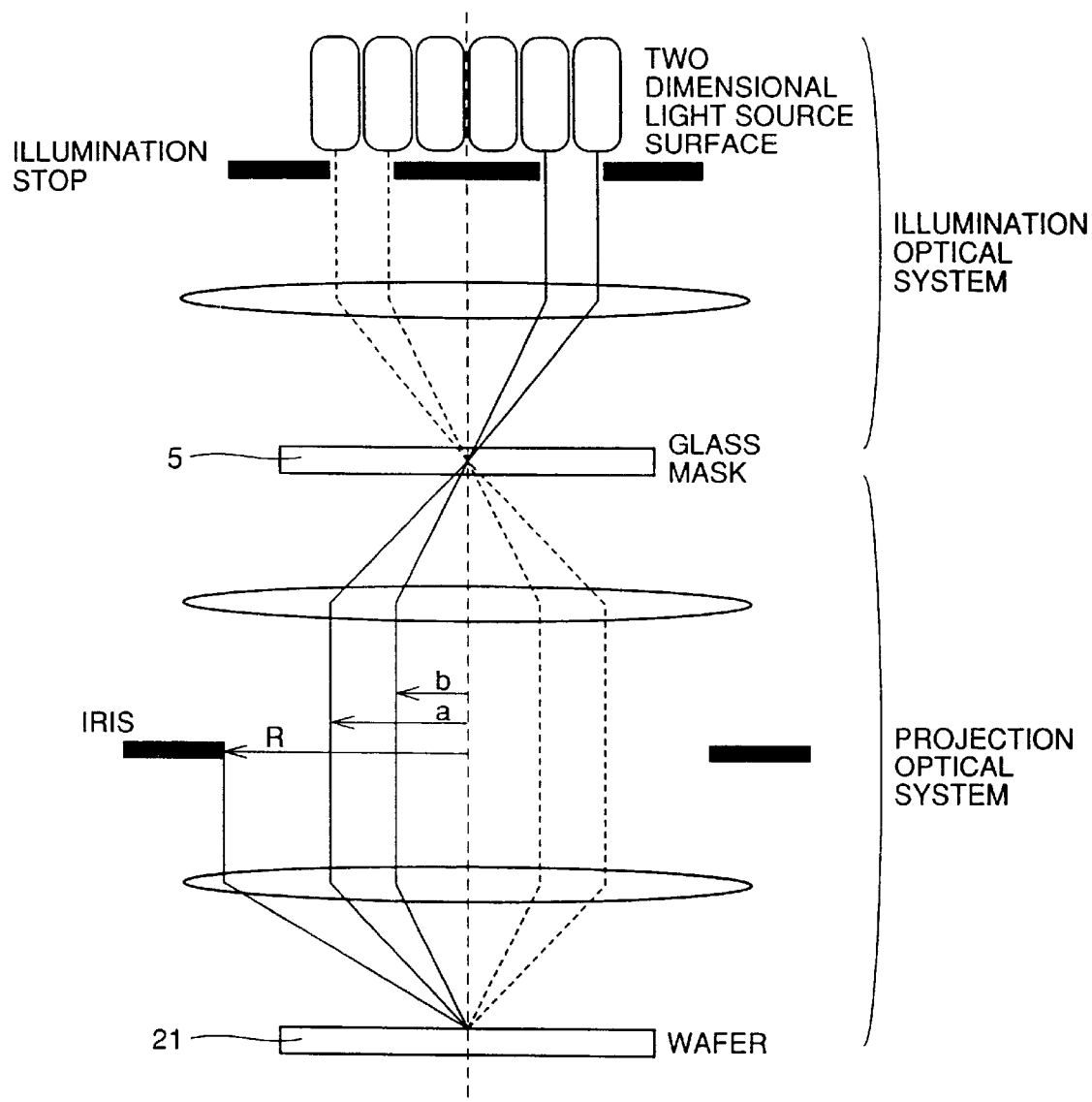
FIG. 13 is a view for describing the definitions of respective parts in the modified illumination.

In addition, as shown in FIG. 13, the radius R of the iris is proportional to the sine (=NA) of the maximum incident angle of the light beam at the image. And the position a at the iris of the maximum incident angle illumination light beam to the photo mask 5 is proportional to the sine of the illumination maximum incident angle and the position b at the iris of the minimum incident angle illumination light beam to the photo mask 5 is proportional to the sine of the illumination minimum incident angle. The coherency a of the interference index of the illumination is given by $\sigma=a/R$ at the time of a conventional illumination. The form of the modified illumination is also a ratio of the sine of the maximum/minimum incident angle to NA, which is represented as $\sigma_{out}=a/R$ and $\sigma_{in}=b/R$. Here, the case in this description is an equal dimension projection and the scaling down ratio r in the projection optical system is 1.

In the exposure by using a ring band illumination stop, it is preferable that the ratio (a/R) of the sine a of the maximum incident angle and the sine R of the maximum incident light beam angle in the projection optical system is 0.6 or more and 0.9 or less. And in the exposure by using a ring illumination stop, it is preferable that the sine b of the minimum incident angle is ½ or more of the sine a of the maximum incident angle.

In addition, in the exposure by using a quadruple polar illumination stop, it is preferable that the ratio (a/R) of the sine a of the maximum incident angle to the sine R of the maximum incident light beam angle in the projection optical system is 0.6 or more and 0.9 or less. And in the exposure by using a quadruple polar illumination stop, it is preferable that the ratio (b/R) of the sine b of the minimum incident angle to the maximum incident light beam angle in the projection optical system is 0.3 or more.

In the present embodiment, since the photoresist 21b is exposed by overexposure via the photo mask 5 which has the pair of aperture patterns 2a for light transmission, the resist dimension is difficult to be changed even when the focus is changed and it becomes possible to precisely form a microscopic pattern with a large process margin. The present inventors confirmed that the above described effects are gained by carrying out the following experiments or the like.

A photo mask 5, as shown in FIGS. 1 and 2, is made to be a two value mask wherein chromium (Cr) is used for a shielding film 2, the line width W1 is 170 nm, the gap W2 is 170 nm and the gap W3 is 360 nm (that is to say, the pitch is 870 nm). This photo mask 5 is exposed under the condition of NA being 0.65 and of ⅔ ring band illumination ($\sigma_{out}/\sigma_{in}=0.80/0.53$) using KrF excimer laser light (wavelength: 248 nm), an optical image which has a relative optical image intensity distribution (relative image intensity) is gained as shown in FIG. 14.

Figure 14:
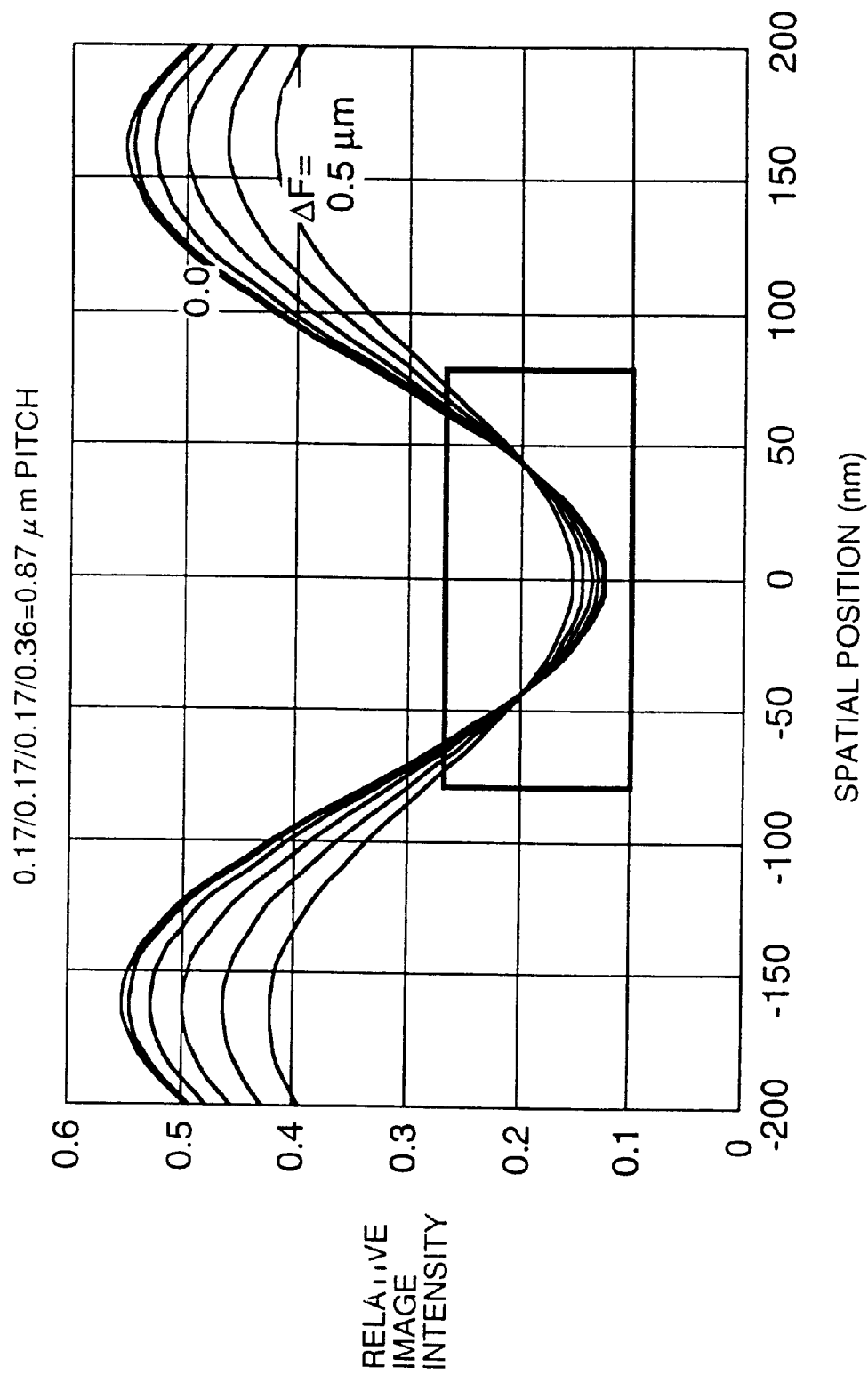
FIG. 14 is a diagram showing the relative optical image intensity distribution in the case that the photo mask is overexposed according to the first embodiment of the present invention.

In FIG. 14 the parts of which the light intensity is high on both right and left sides in the optical image intensity distribution correspond to the pair of aperture patterns 2a for light transmission while a part of which the light intensity is low in between corresponds to the shielding part sandwiched between the pair of aperture patterns 2a for light transmission. This optical image intensity distribution indicates focus position by changing in the range of 0 to 0.5 μm. An enlarged view of the part surrounded by a rectangle of thick line in the figure is shown in FIG. 15.

Figure 15:
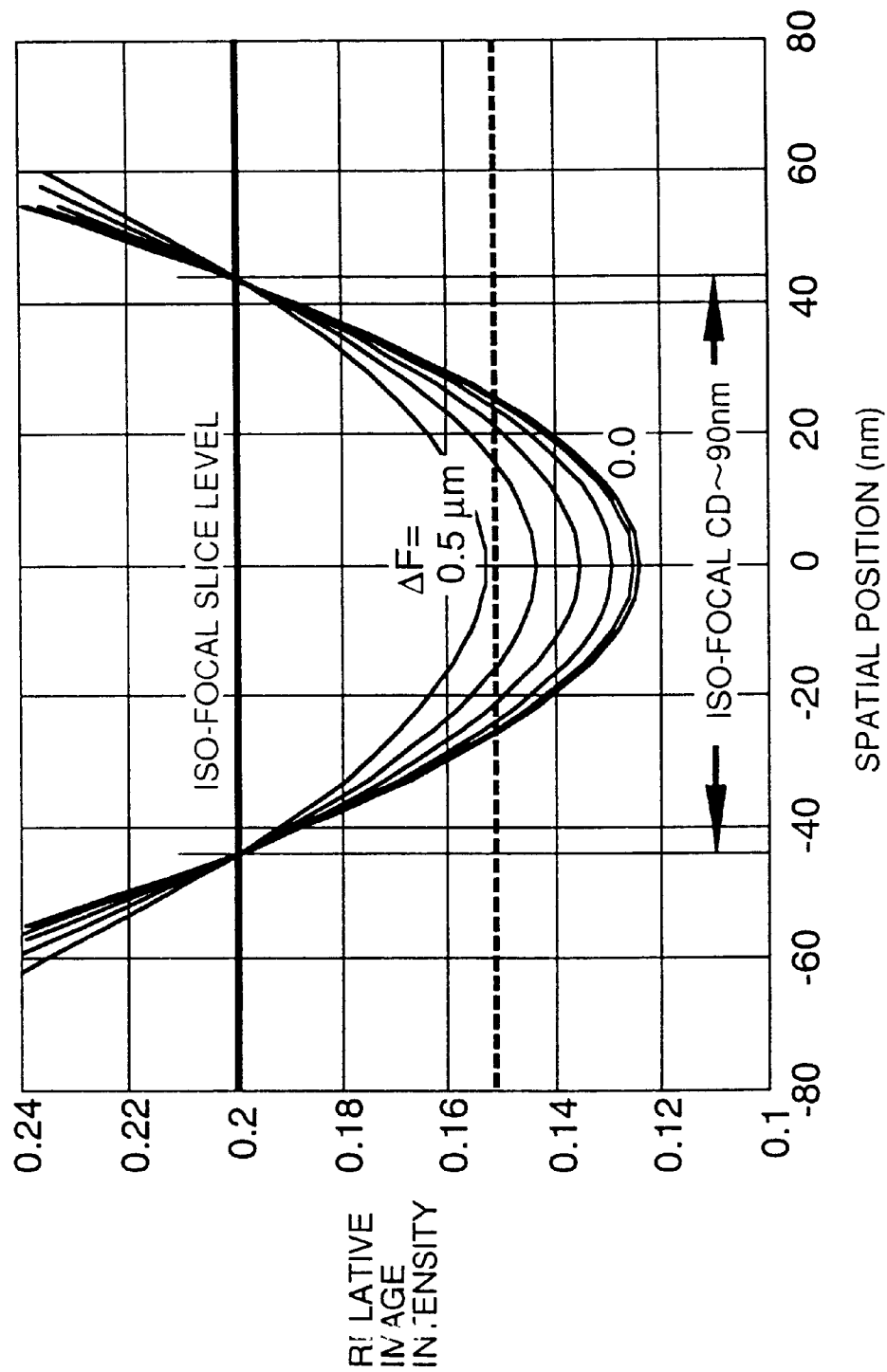
FIG. 15 is an enlarged view of the part surrounded by a thick line rectangular in FIG. 14.

Referring to FIG. 15, it is understood that the light intensity wherein the patterning dimension of the photoresist does not change even when the focus is changed (Iso-Focal Slice Level) can be gained by adjusting the amount of exposure. In addition, it is understood that this light intensity without dimensional fluctuation can make the dimension of the image (pattern) to be microscopic to the degree of 90 nm. That is to say, by carrying out an overexposure using the photo mask 5, as shown in FIGS. 1 and 2, a microscopic pattern with little dimensional fluctuation due to defocusing can be formed.

In addition, in order to form a pattern on the positive type photoresist, the light intensity of the shielding pattern part sandwiched between a pair of aperture patterns for light transmission needs to be smaller than a certain level (resolution criteria) compared to the pattern edge. In the case that this image, light intensity becomes larger than that level at the time of defocusing by 0.5 μm and, therefore, it can be understood that the depth of focus of 1.0 μm or less can be gained.

That is to say, it is understood that, by carrying out an overexposure using the photo mask 5, as shown in FIGS. 1 and 2, a large depth of focus can be secured in the formation of microscopic patterns with little dimensional fluctuation.

Figure 16:
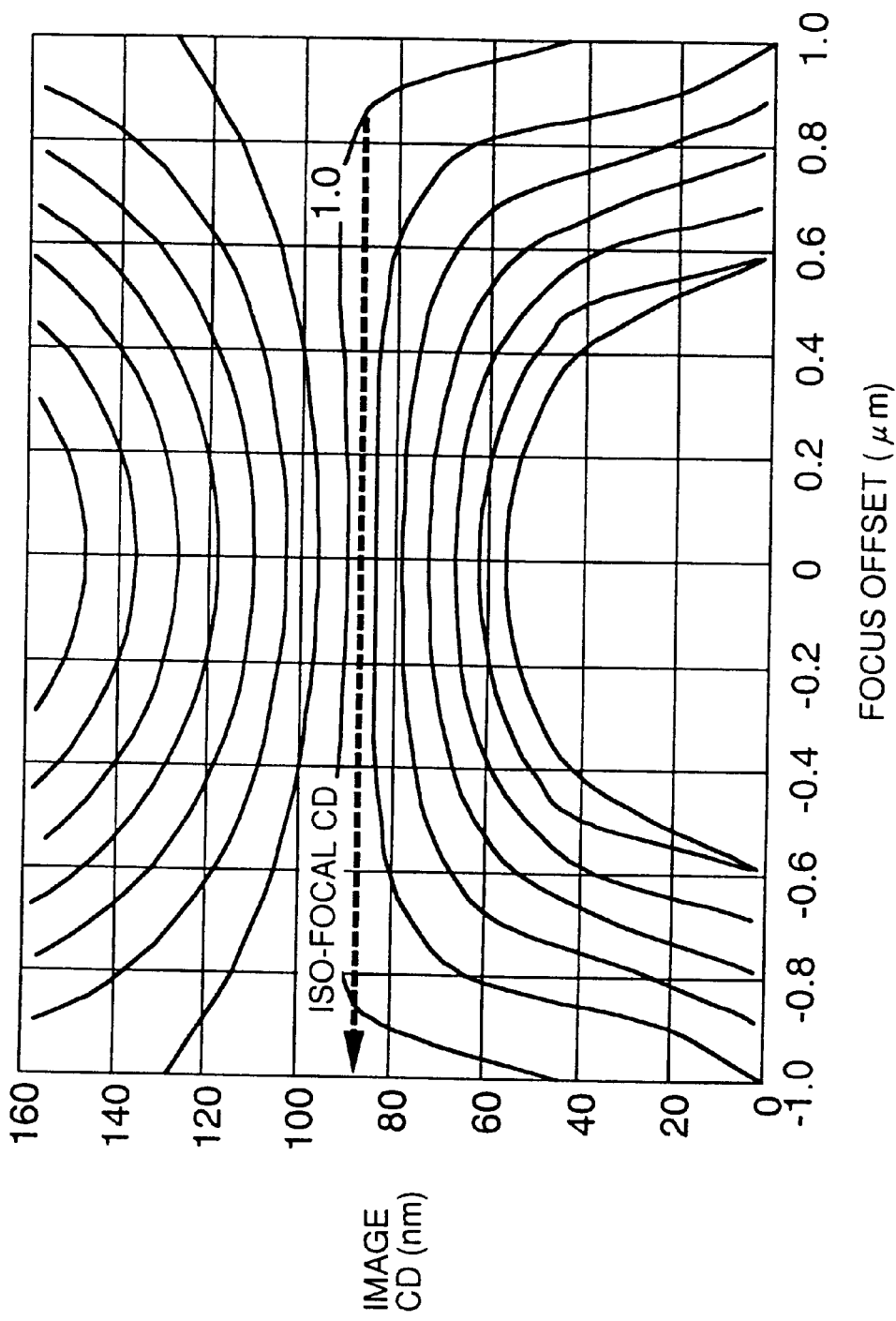
FIG. 16 is a diagram showing the relationship between the CD value and the focus offset in the case that the photo mask is overexposed according to the first embodiment of the present invention.

FIG. 16 shows the relationship (CD-Focus characteristics) between the CD (critical dimension) value and the focus offset in the case of FIGS. 14 and 15. As is clear from FIG. 16, in the range of the CD value of 80 nm to 90 nm even in the case that the focus changes the CD value changes little and it is understood that the CD-Focus characteristics are excellent.

Figure 17:
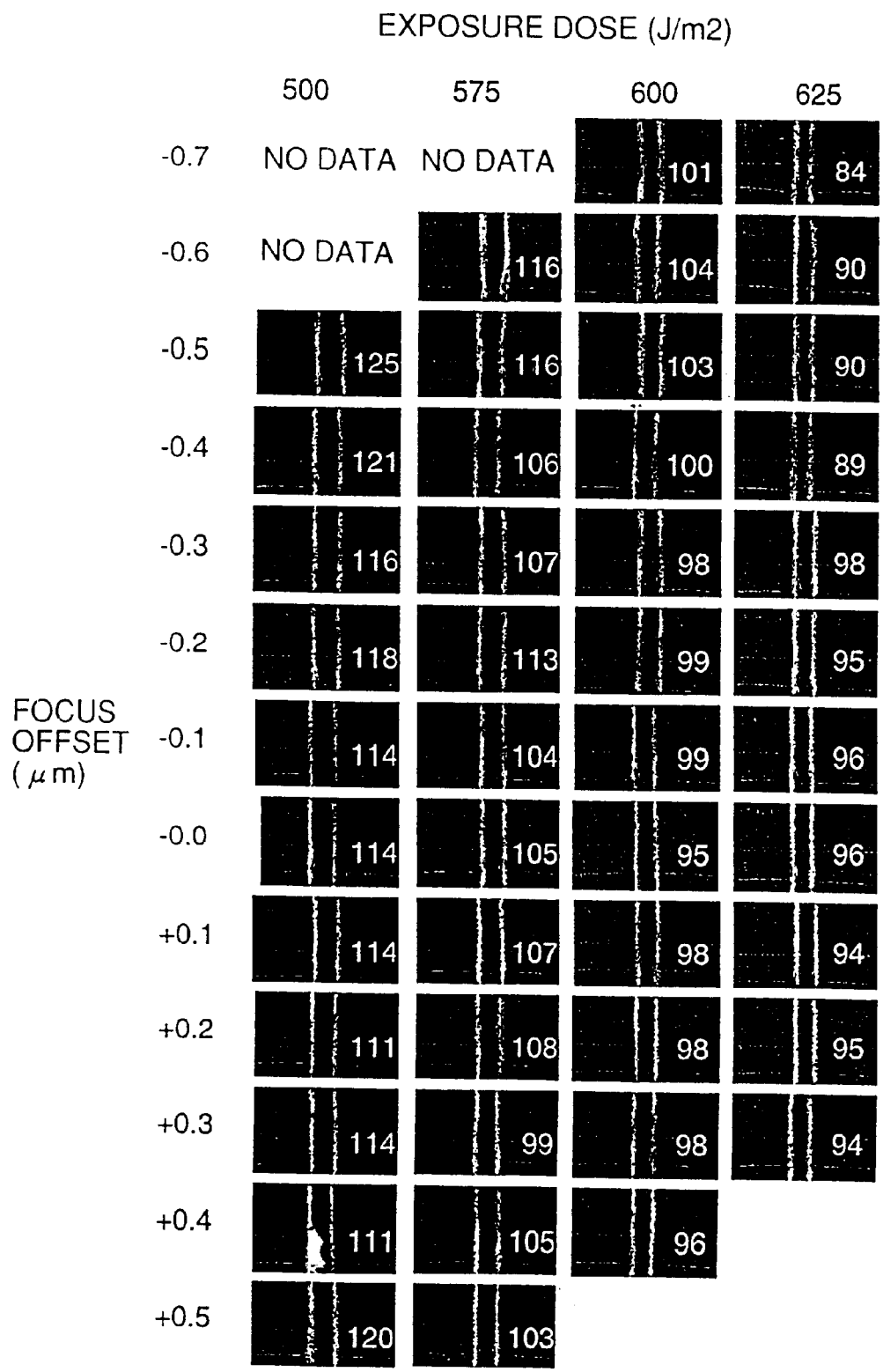
FIG. 17 is a SEM photograph taken as the top view of the resist pattern when the focus offset and the exposure dose are changed in the case that the photo mask is overexposed according to the first embodiment of the present invention.

FIG. 17 shows the top view of the pattern of the photoresist in the case that the photo mask pattern, as shown in FIGS. 1 and 2, is copied to the photoresist by changing the focus offset and the exposure amount in the above described exposure condition. Referring to FIG. 17, the numeral values attached in the photograph are measurement values of the CD value. As can be seen from this result, the dimension of the pattern actually copied to the photoresist changes little even in the case that the focus changes.

Figure 18:
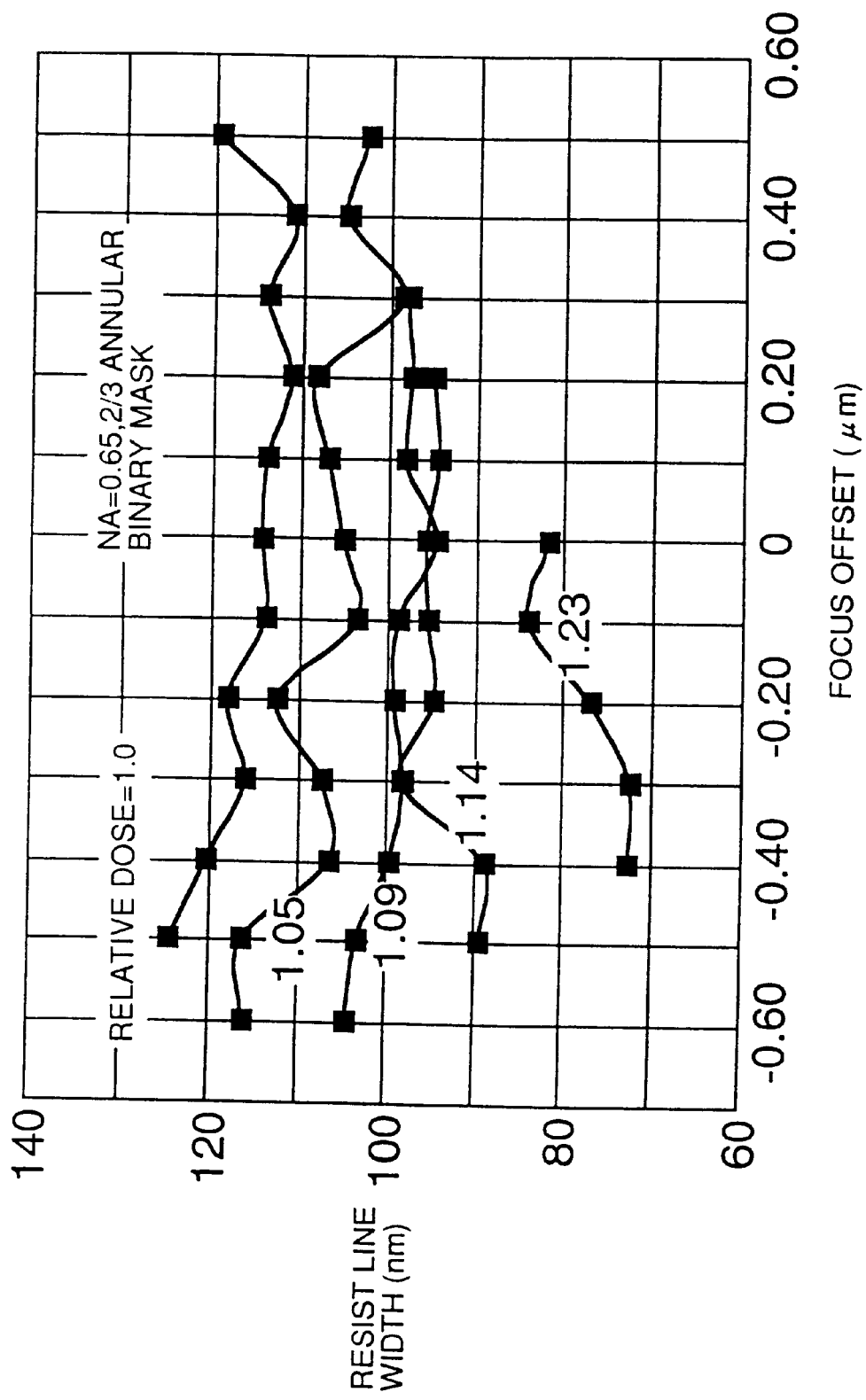
FIG. 18 is a diagram showing the relationship between the line width and the focus offset of the resist.

In addition, FIG. 18 shows the relationship between the line width of the photoresist pattern (resist line width) and the focus offset in the case that an exposure is carried out by a modified illumination using a photoresist (two value mask) 5 which has a shielding film 2 of Cr as shown in FIGS. 1 and 2. Referring to FIG. 18, it is understood that the photoresist pattern of the line width up to 100 nm can be formed in the range of depth of focus up to 1.0 μm according to a pattern formation method of the present embodiment.

Next, it is described that, in the case that the pattern formed in the photo mask is a line and space (L/S) pattern, an isolated dark line pattern or an isolated bright line pattern, excellent characteristics such as in the present embodiment cannot be gained even when the exposure amount is changed to make the lines thinner.

Figure 19:
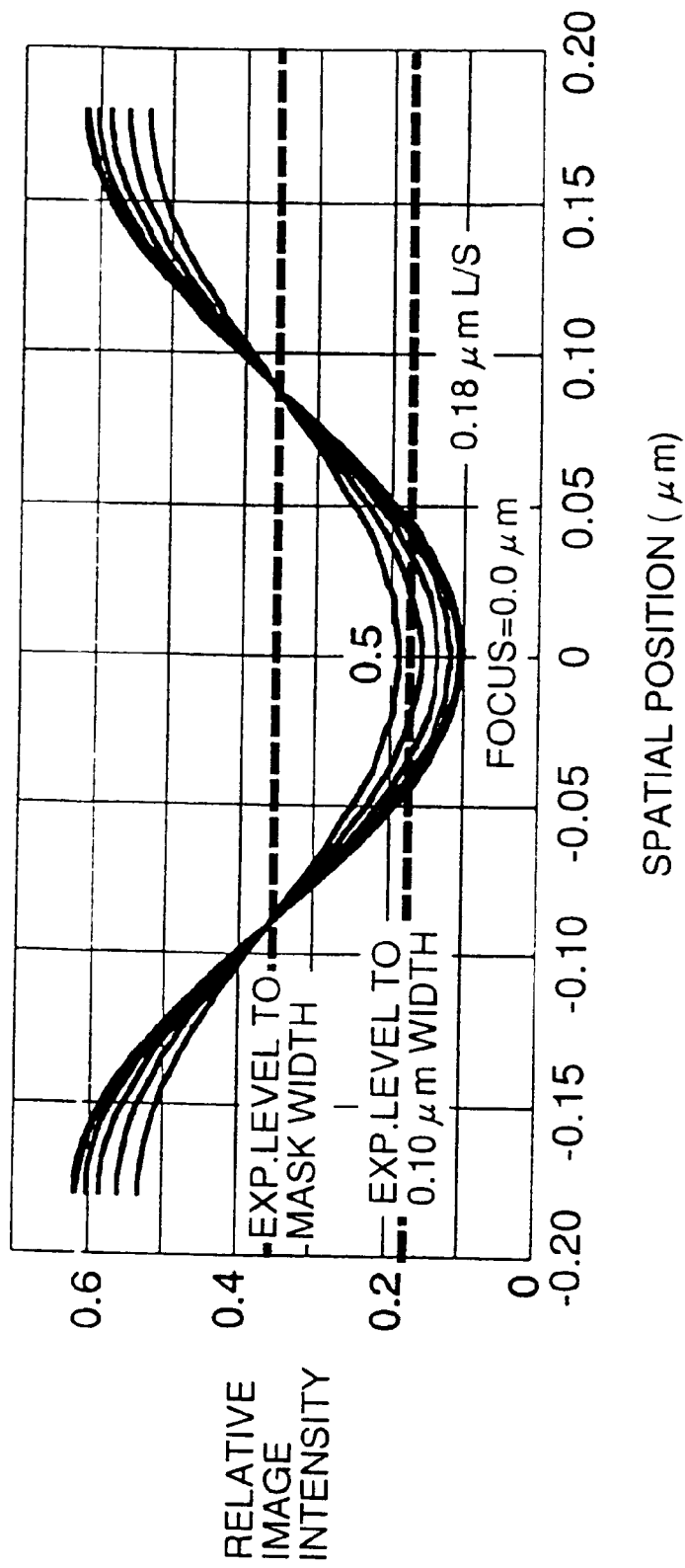
FIG. 19 is a diagram showing the relative optical image intensity distribution in 0.18 μm L/S.
Figure 20:
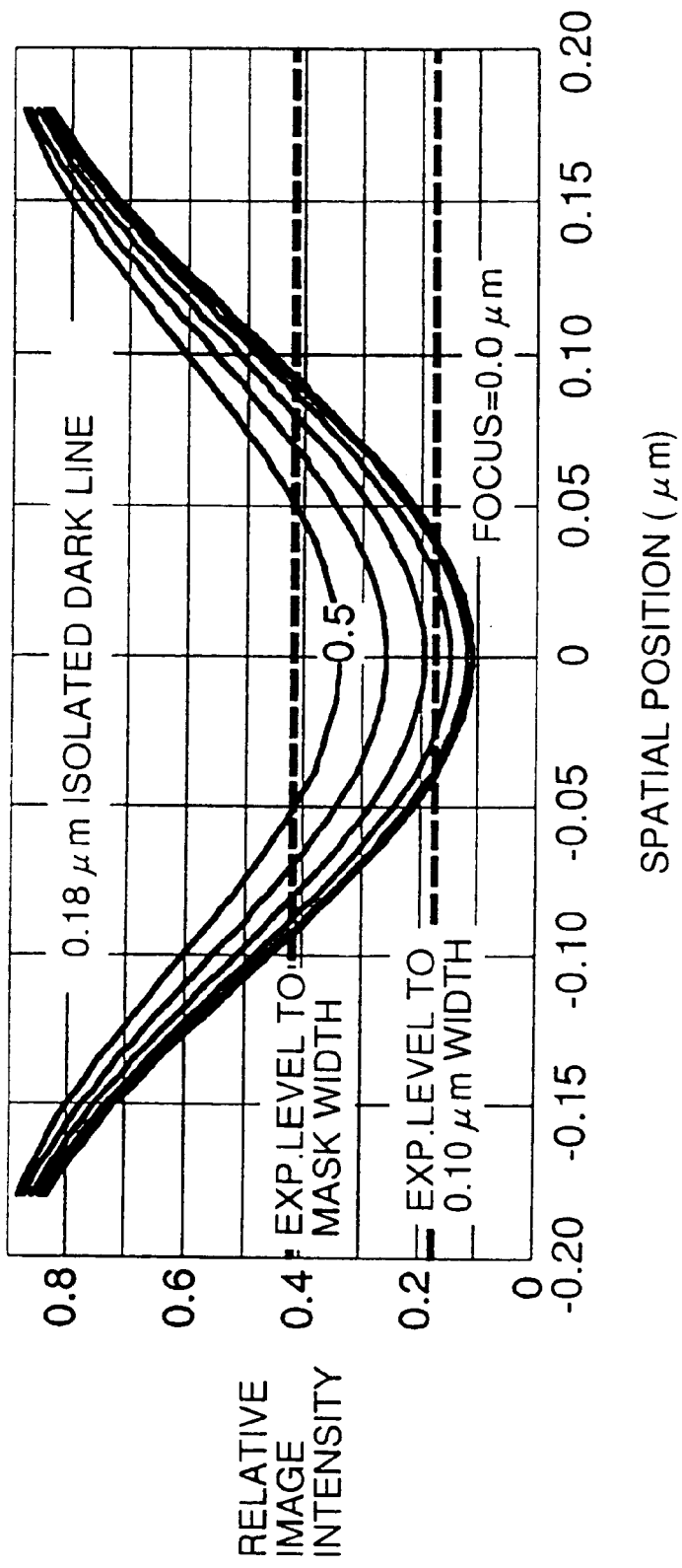
FIG. 20 is a diagram showing the relative optical image intensity distribution in isolated dark lines of 0.18 μm in width.
Figure 21:
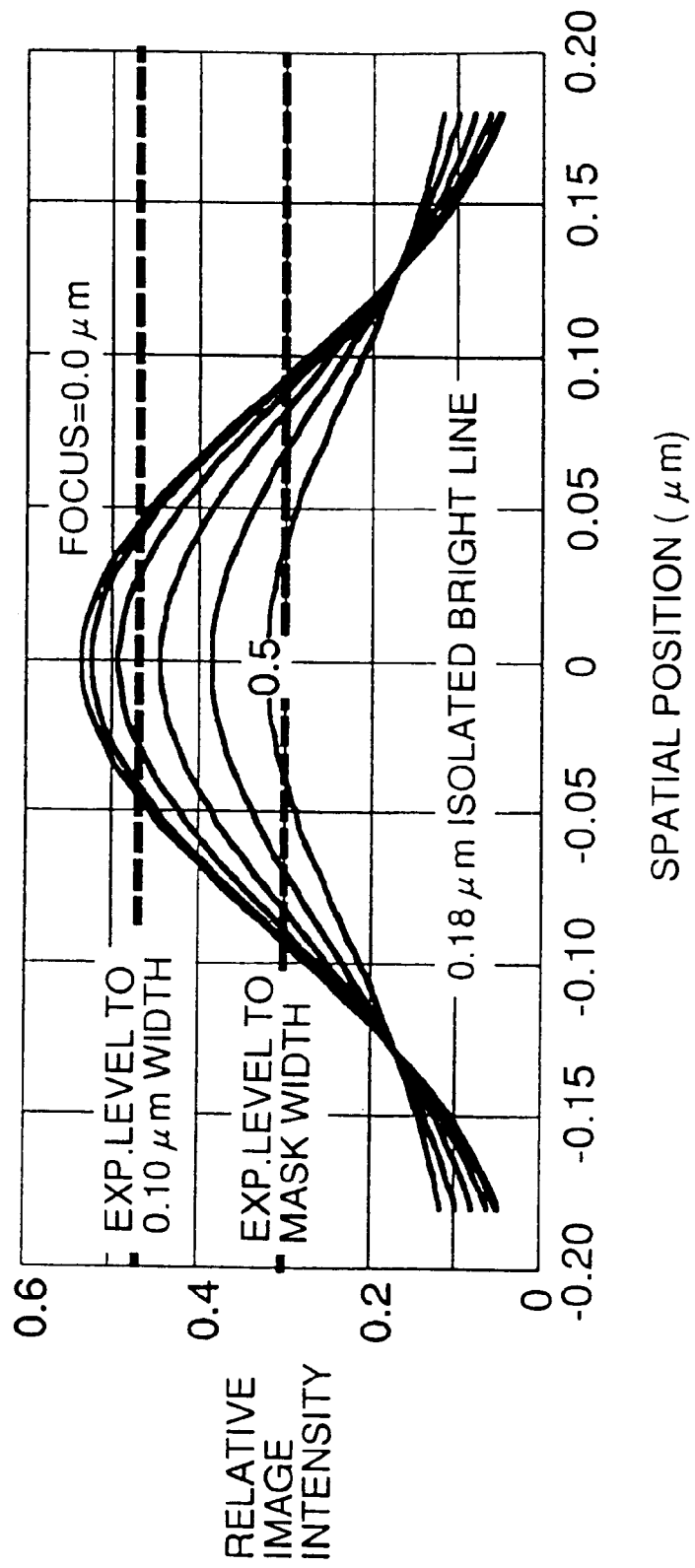
FIG. 21 is a diagram showing the relative optical image intensity distribution in isolated bright lines of 0.18 μm in width.

FIGS. 19, 20 and 21 show the relative optical image intensity distribution wherein the focus is taken as a parameter in each case of 0.18 μm L/S (both the line width and the space width are 0.18 μm), isolated dark lines of 0.18 μm in width and isolated bright lines of 0.18 μm in width.

Broken lines in those FIGS. 19 the 21 indicate light intensity corresponding to the exposure amount when the dimension is exactly the same as the mask (0.18 μm) at the optimum focus (Exp. Level to Mask Width) and the light intensity corresponding to the exposure amount at the time of making the dimension of 0.10 μm (Exp. level to 0.10 μm width). It is expected from these FIGS. 19 to 21 that, in either case of the three patterns, the fluctuation of the dimension becomes large for the change of focus when the width of the pattern is attempted to be made thinner.

Figure 22:
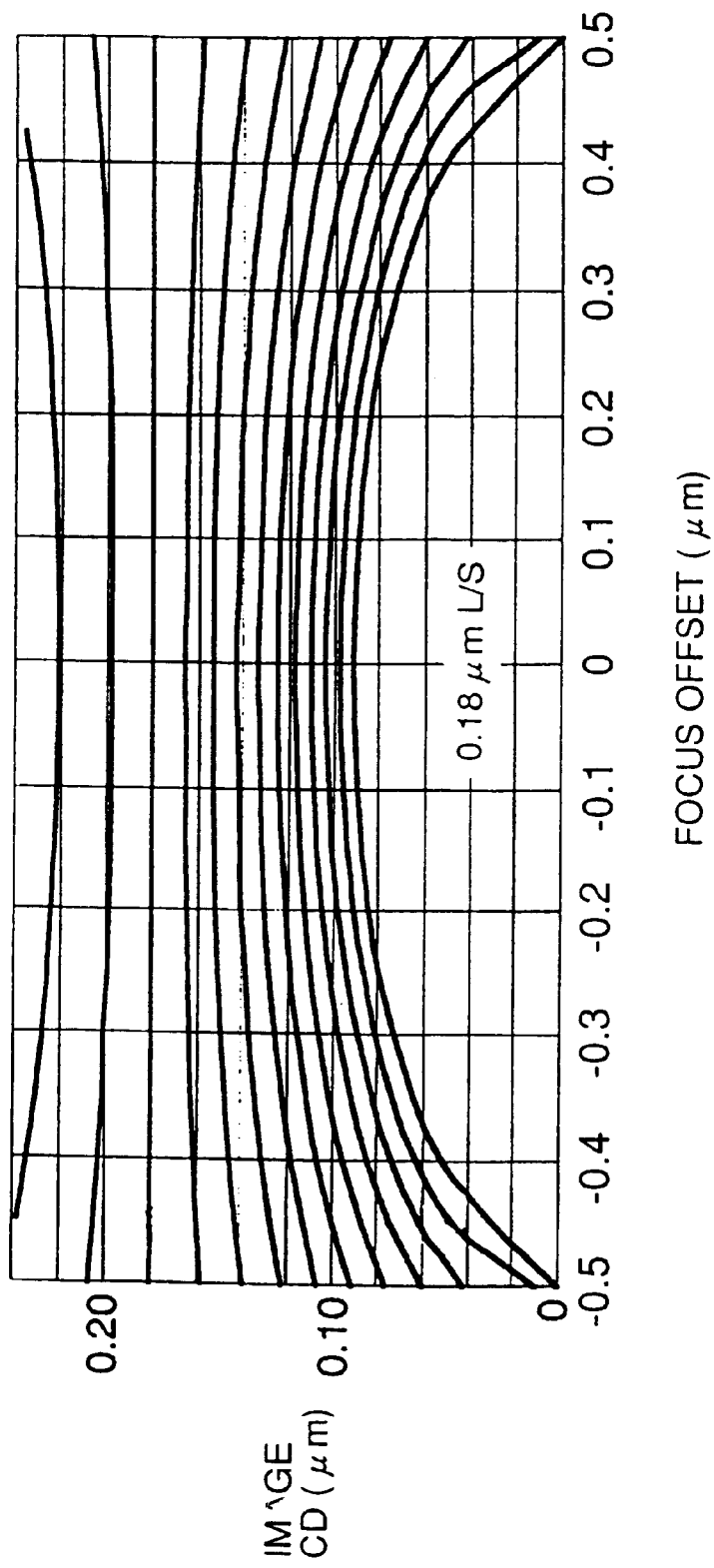
FIG. 22 is a diagram showing the relationship between the CD value and the focus offset in 0.18 μm L/S.
Figure 23:
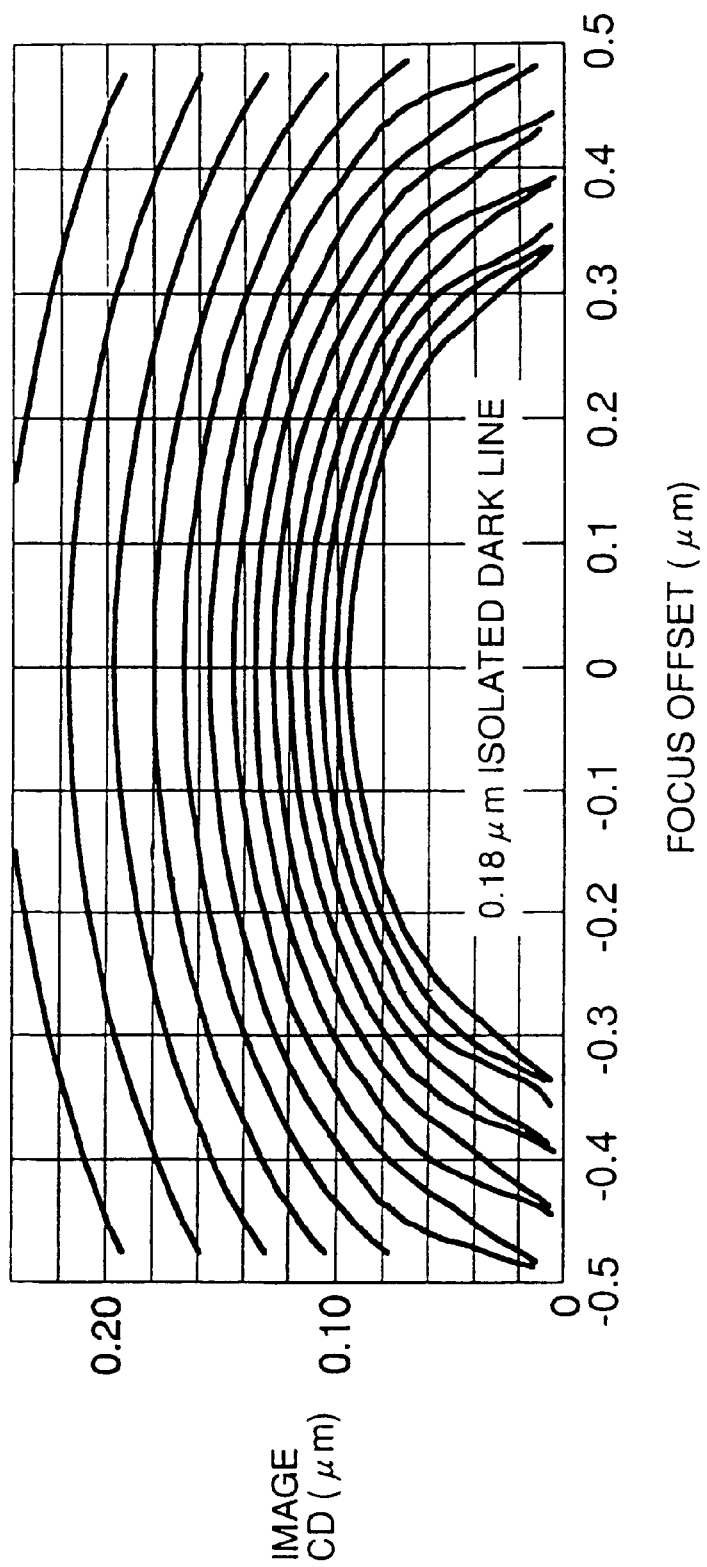
FIG. 23 is a diagram showing the relationship between the CD value and the focus offset in isolated dark lines of 0.18 μm in width.
Figure 24:
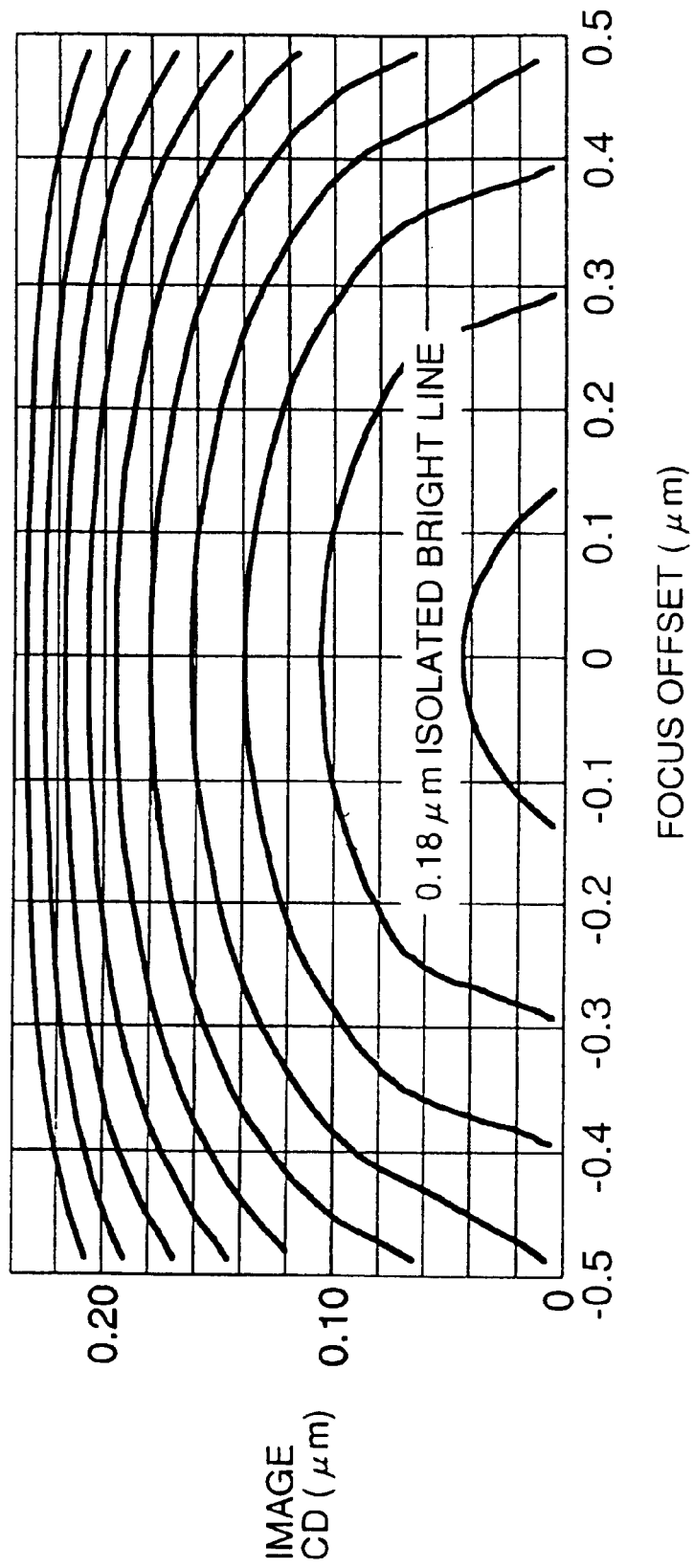
FIG. 24 is a diagram showing the relationship between the CD value and the focus offset in isolated bright lines of 0.18 μm in width.

FIGS. 22, 23 and 24 show the CD-Focus characteristics in the case that the exposure level is finely changed in each case of 0.18 μm L/S, isolated dark line of 0.18 μm in width and isolated bright lines of 0.18 μm in width. The relationship between the CD value and the focus offset, as shown in FIGS. 22 to 24, exhibits the behavior expected from the image intensity as shown in FIGS. 19 to 21. That is to say, the smaller the dimension (CD value) is made, the larger the fluctuation of the CD value in response to the fluctuation of the offset becomes and, it is understood that the CD-Focus characteristics are not excellent. In addition, though 0.18 μm L/S is smaller in fluctuation of the CD value in response to the fluctuation of the focus offset compared to the isolated dark lines of 0.18 μm in width isolated bright lines of 0.18 μm in width, the dimension change up to 0.02 μm still occurs in response to the defocus by 0.3 μm and, therefore, CD-Focus characteristics become poorer compared to the present embodiment.

As described above, since the pattern in the present embodiment is made to have isolated pairs of aperture patterns 2a for light transmission, it is understood that excellent CD-Focus characteristics, which cannot be gained in other patterns, are gained.

Next, the dimension of each part of the aperture patterns 2a for light transmission as shown in FIGS. 1 and 2 is considered.

Figure 25:
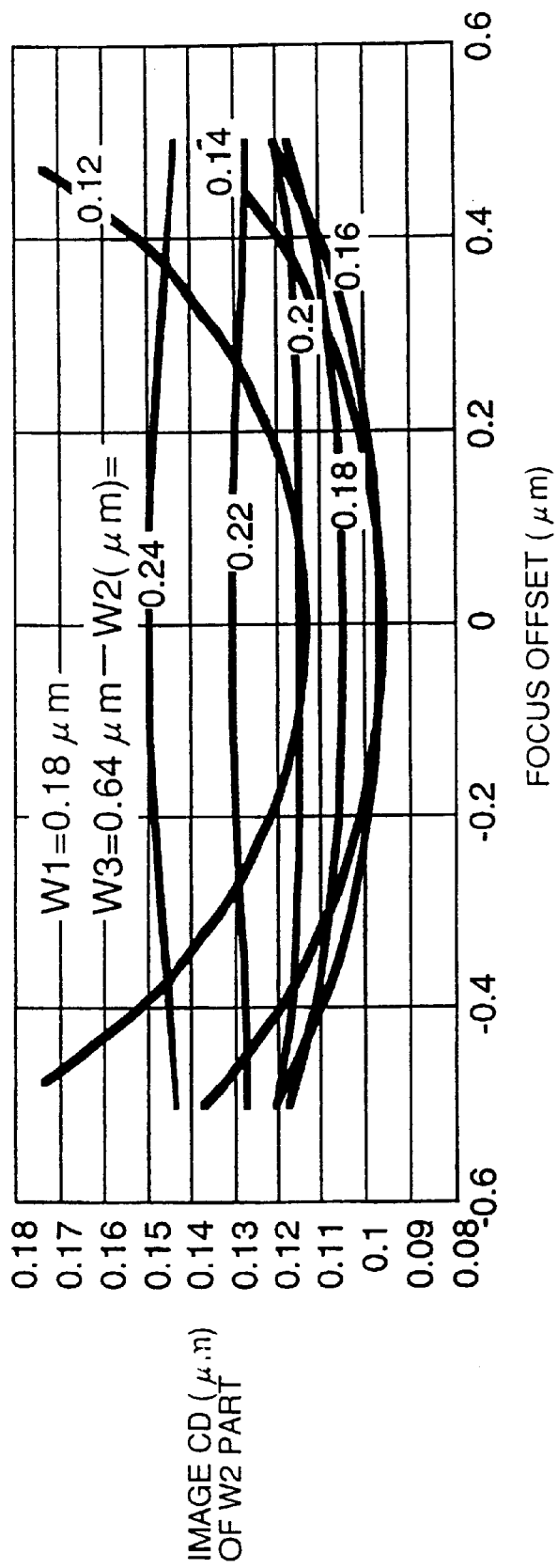
FIG. 25 is a diagram showing the relationship between the CD value and the focus offset when the dimension W2 of the photo mask is changed according to the first embodiment of the present invention.
Figure 26:
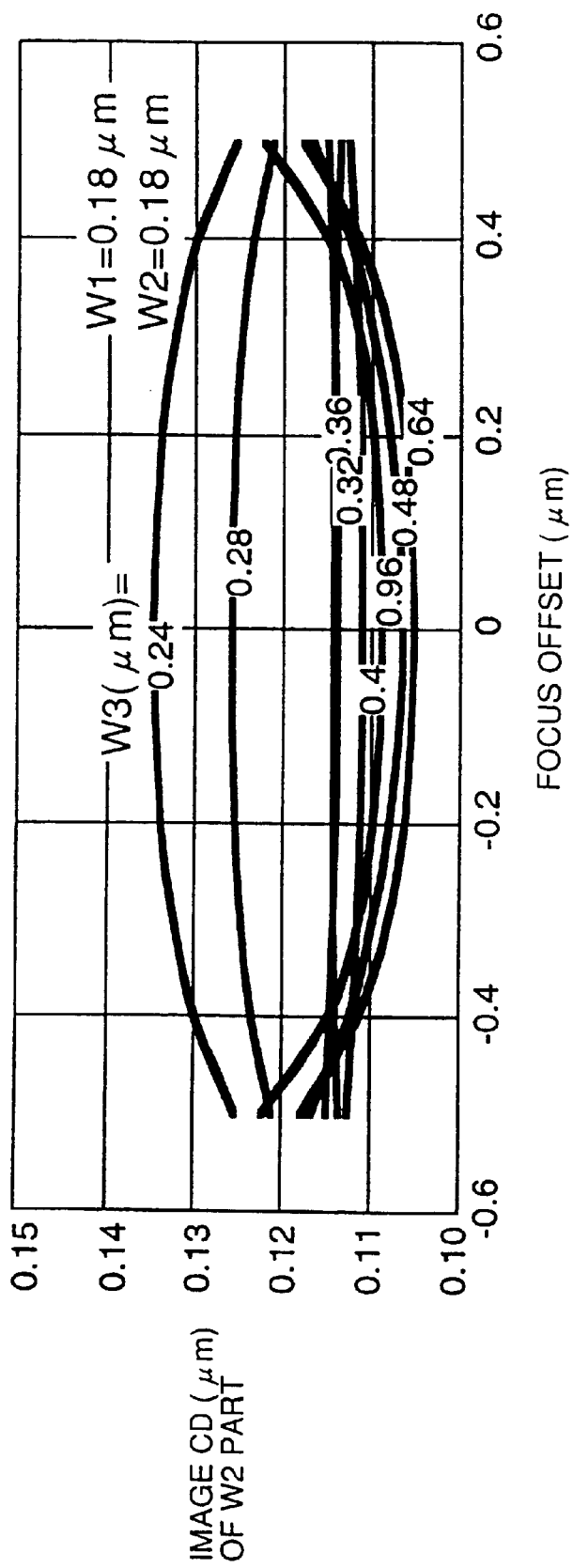
FIG. 26 is a diagram showing the relationship between the CD value and the focus offset when the dimension W3 of the photo mask is changed according to the first embodiment of the present invention.
Figure 27:
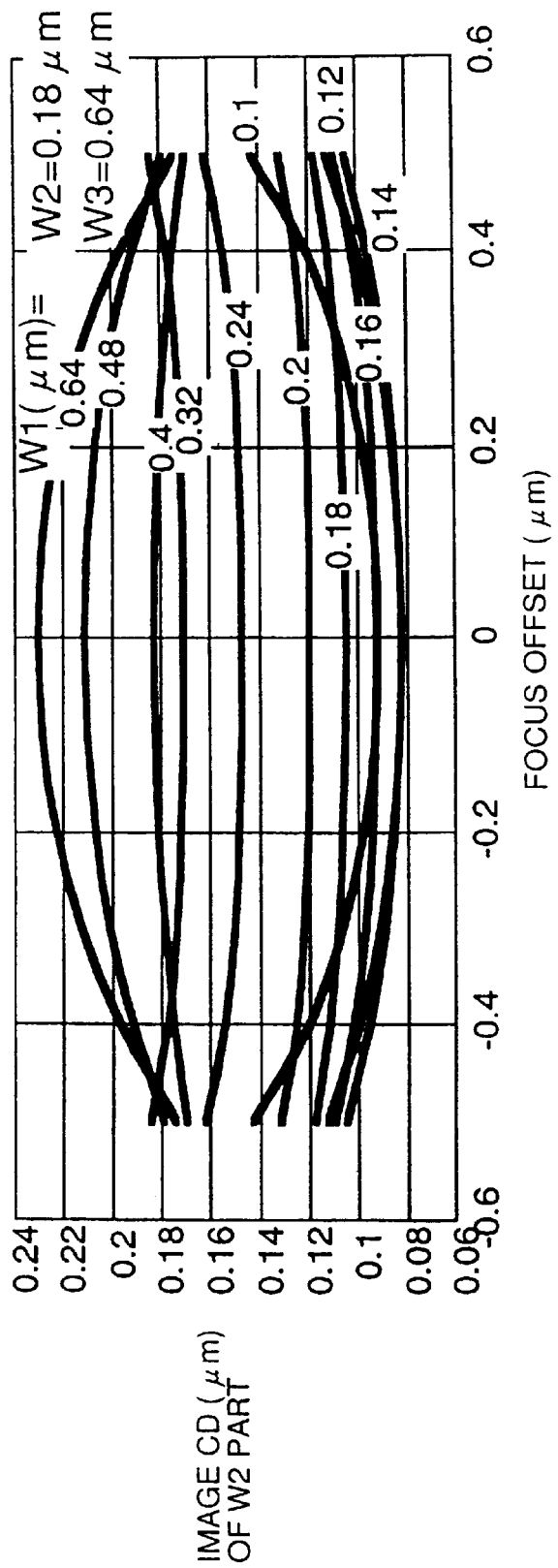
FIG. 27 is a diagram showing the relationship between the CD value and the focus offset when the dimension W1 of the photo mask is changed according to the first embodiment of the present invention.

FIGS. 25, 26 and 27 show the CD-Focus characteristics when each of the dimensions W1, W2 and W3 of each part of the photo mask as shown in FIGS. 1 and 2 is varied.

In the measurement in FIGS. 25 to 27, the exposure level is adjusted so that the image contrast which can resolve the pattern in the range of the focus of 0 to 0.5 μm can be gained for each mask pattern. And the adjustment is carried out so that W2/W1 becomes a constant in the smallest dimension. In addition, assuming that the exposure amount may be changed when the mask pattern is changed, the CD-Focus characteristics of the minimum dimension (resist) pattern which can be resolved up to the defocus of 0.5 μm are gained.

First, as shown in FIG. 25, when the dimension W2 is in the range of 0.16 to 0.20 μm, the CD value is small and the fluctuation of the CD value according to the fluctuation of the focus offset is also small (that is to say, the focus characteristics are excellent). On the other hand, when the dimension W2 is in the range of 0.14 to 0.12 μm, the CD value becomes smaller and the fluctuation of the CD value according of the fluctuation of the focus offset becomes larger so that the focus characteristics become worse. On the other hand, when the dimension W2 is made to be in the range of 0.22 to 0.24 μm, it is understood that the CD value can be made larger with excellent focus characteristics where the fluctuation of the CD value is small in response to the fluctuation of the focus offset. In view of such a result, a preferable range of the dimension W2 becomes as follows:

$$0.35 < W2/(\lambda/NA)$$

when the wave length λ of the exposure light at the time of exposing and the numerical aperture NA of the projection optical system are taken into consideration.

Next, as shown in FIG. 26, in the case that the dimension W3 is larger than 0.32 μm, the dimension (CD value) of a dark line sandwiched between a pair of aperture patterns 2a for light transmission becomes smaller and the fluctuation of the CD value in response to the fluctuation of the focus offset becomes smaller so that the focus characteristics improve. On the other hand, when the dimension W3 is 0.28 or 0.24, the focus characteristics are excellent, but the CD value becomes larger. In view of this result, a preferable range of the dimension W3 becomes as follows:

$$W3 > 0.70 \times (\lambda/NA)$$

when the wave length λ of the exposure light at the time of exposing and the numerical aperture NA of the projection optical system are taken into consideration.

Next, as shown in FIG. 27, when the dimension W1 is 0.24 or more, the CD value becomes too large and, on the contrary, when the dimension W1 is 0.10 or less the CD value becomes larger and the fluctuation of the CD value in response to the fluctuation of the focus offset becomes larger so that the focus characteristics become worse. In view of this result, a preferable range of the dimension W1 becomes as follows:

$$0.35 < W1/(\lambda/NA) < 0.65$$

when the wave length λ of the exposure light at the time of exposing and the numerical aperture NA of the projection optical system are taken into consideration.

From the above described relational expressions, the following expressions are gained.

$$W2/W1 > 0.35/0.65 \approx 0.54$$

$$W3/W1 > 0.70/0.65 \approx 1.08$$

As for the pattern length L of the pairs of aperture patterns 2a for light transmission as shown in FIGS. 1 and 2, the dimension changes in the region of 0.3 μm or less from both of the edge parts in the longitudinal direction of the patterns and, therefore, the pattern length L is required to be 0.6 μm or more in the case that the optical proximity effect correction (OPC: the mask dimension is altered at edge parts) is not carried out. This is taken into consideration to find a preferable range of the pattern length L as follows:

$$1.3 < d(\lambda/NA)$$

(Second Embodiment)

Figure 28:
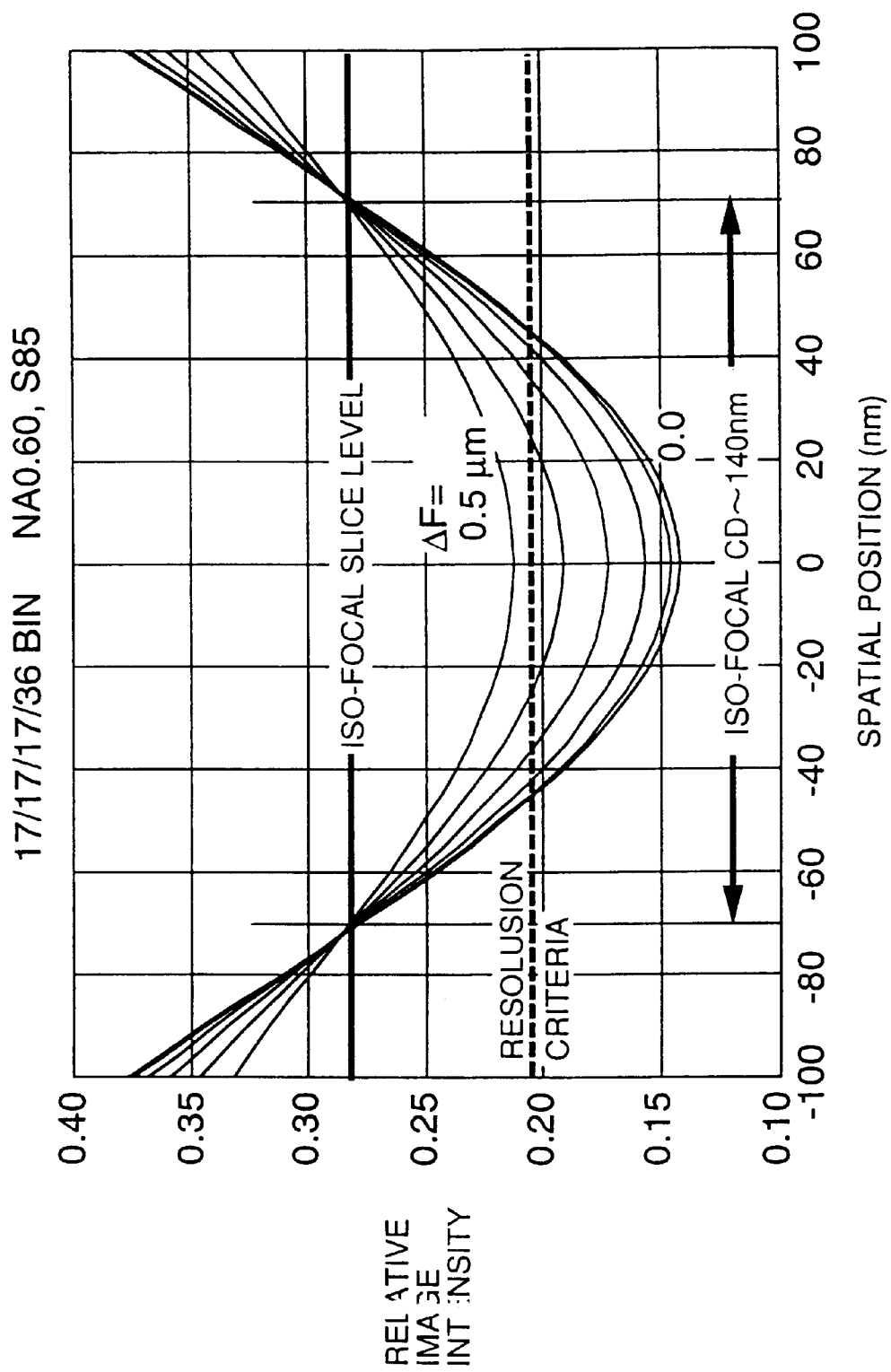
FIG. 28 is a diagram showing the relative optical image intensity distribution in the case that the photo mask is exposed by using an ordinary illumination according to the second embodiment of the present invention.
Figure 29:
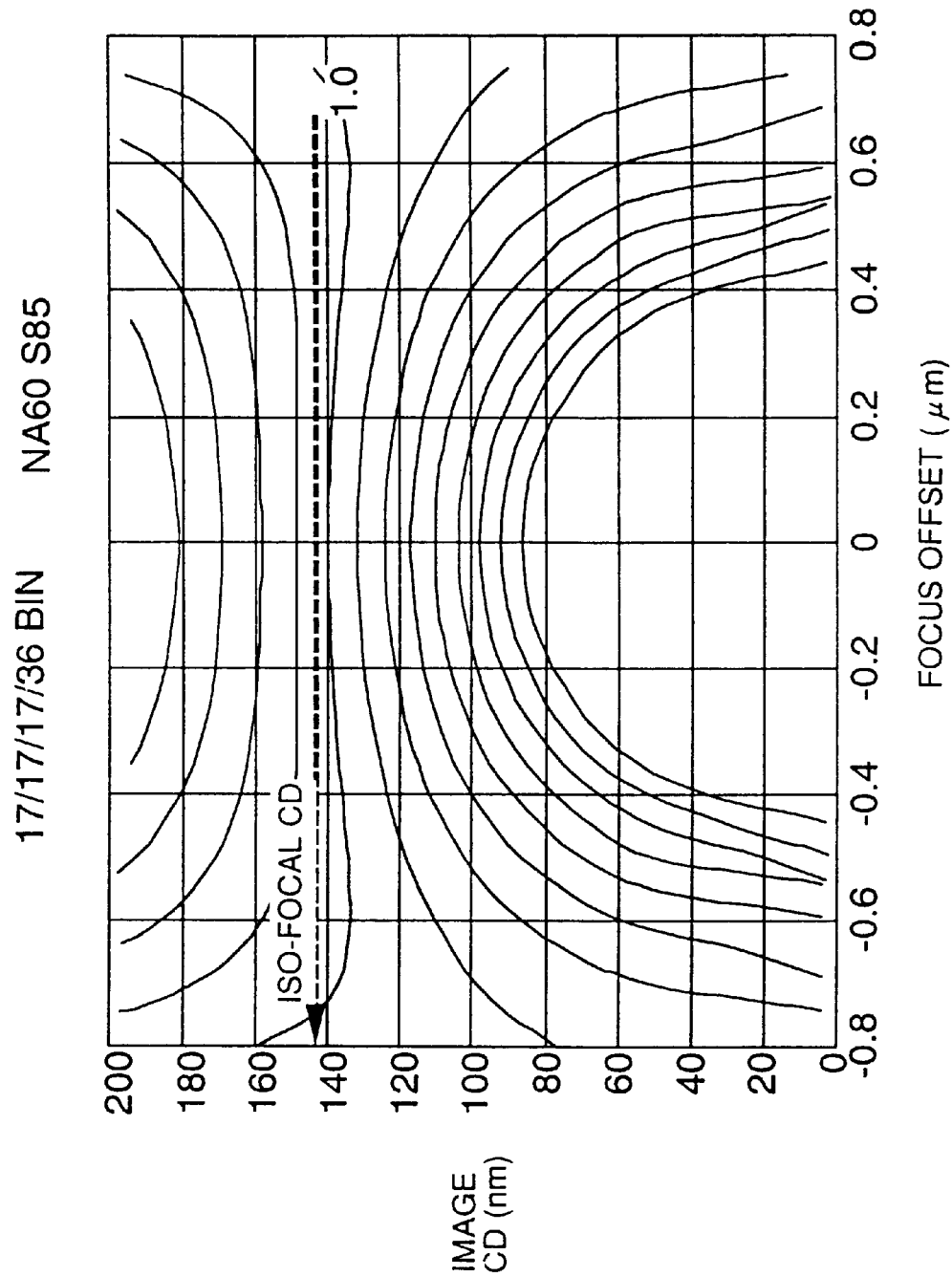
FIG. 29 is a diagram showing the relationship between the CD value and the focus offset in the case that the photo mask is exposed by using an ordinary illumination according to the second embodiment of the present invention.

The relative optical image intensity distribution as a result of the calculation is shown in FIG. 28 and the CD-Focus characteristics are shown in FIG. 29 at the time of the exposure through an ordinary illumination (σ=0.85) by KrF excimer laser light using the same photo mask 5 (FIGS. 1 and 2) as in the first embodiment when the NA is 0.60.

Referring to FIGS. 28 and 29, it is understood that lines of the line width of 140 nm can be formed with the characteristics that the CD value is varied little in response to the focus by carrying out an overexposure using the photo mask 5 of FIGS. 1 and 2 even when the super resolving method is not used at all.

(Third Embodiment)

Figure 30:
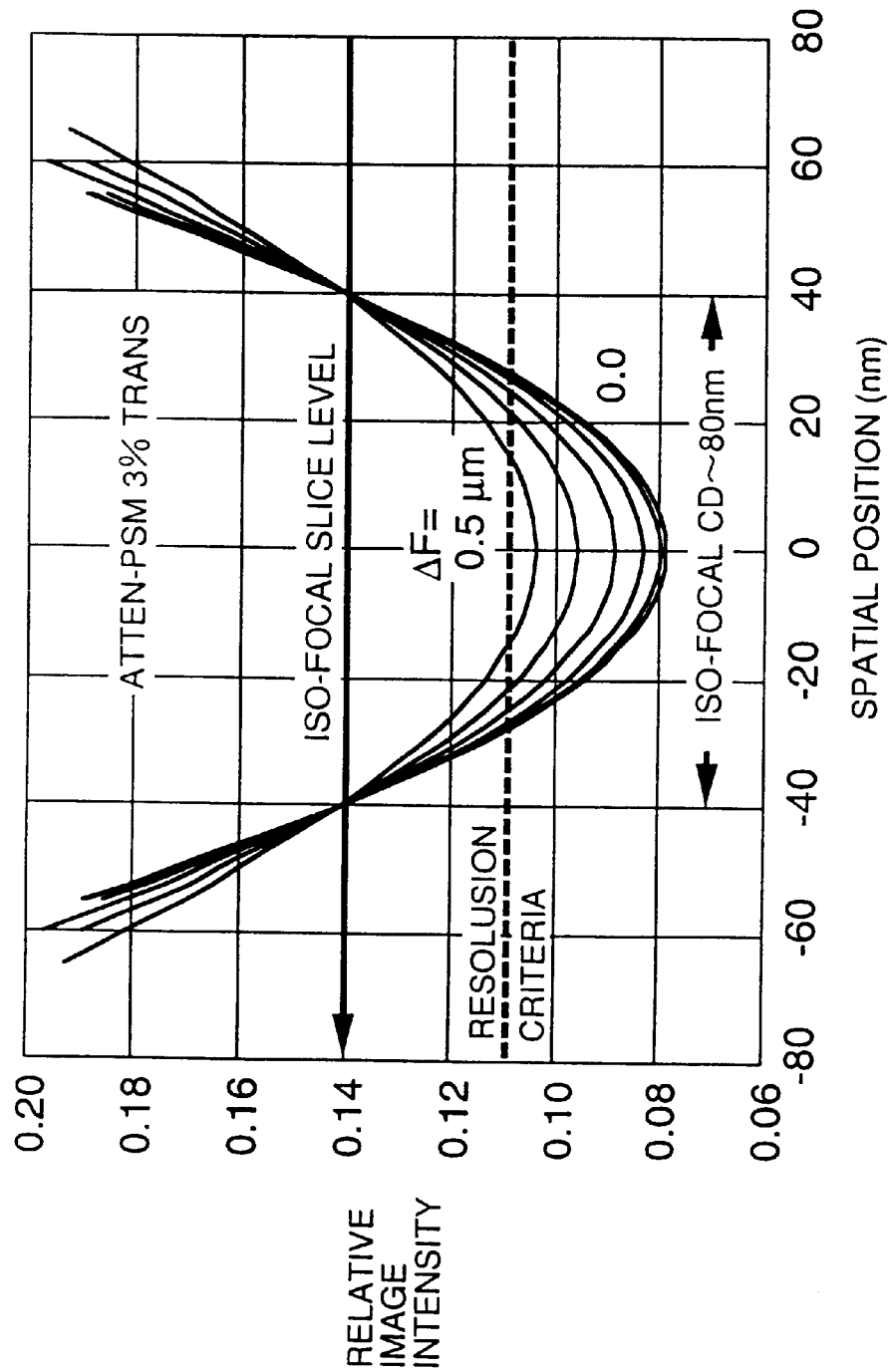
FIG. 30 is a diagram showing the relative optical image intensity distribution in the case that the exposure is carried out by using an attenuating phase shift mask according to the third embodiment of the present invention.

The optical image intensity distribution gained by the calculation is shown in FIG. 30 at the time of the exposure through a ⅔ ring band illumination ($\sigma_{out}/\sigma_{in}$=0.80/0.53) by using an attenuating phase shift mask (Atten-PSM) wherein a semi-transmissive shielding film 2 allows 3% of the exposure light to transmit as shown in FIG. 12 with the same dimension as that in the first and second embodiments when the numerical aperture NA of the projection optical system is 0.65. From the result of FIG. 30, it is understood that the dimension where the pattern dimension of the photoresist does not fluctuate in response to the focus fluctuation is 80 μm, which is smaller than that in the first embodiment. In addition, it is understood that the image quality which can be resolved is maintained at the time of defocusing of 0.5 μm.

Figure 31:
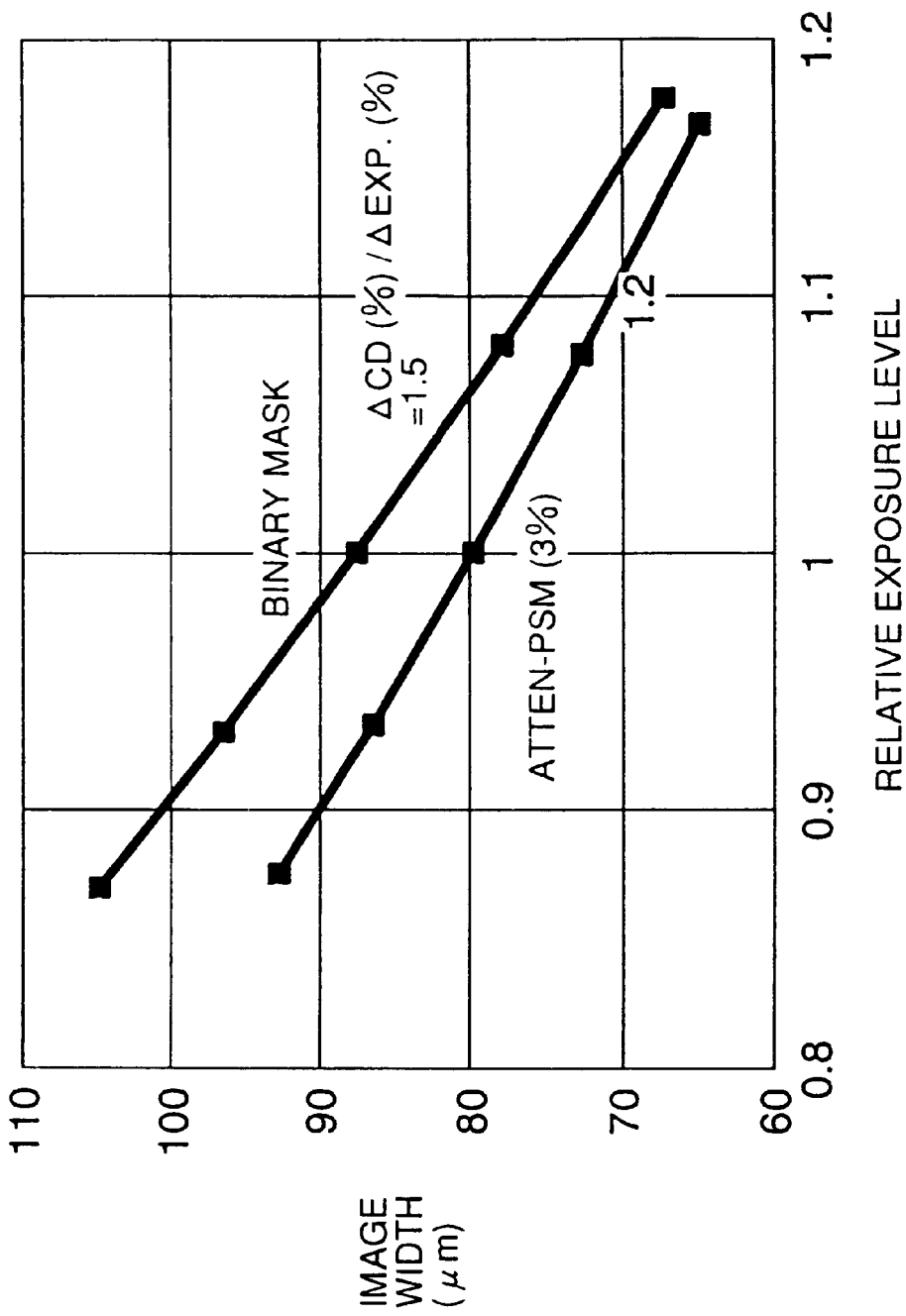
FIG. 31 is a diagram showing the relationship between the image width and the relative exposure amount in a two value mask and an attenuating phase shift mask.

The research result of the margin of the exposure amount with respect to the two value mask 5 which is used in the first embodiment and the attenuating phase shift mask of the present embodiment is shown in FIG. 31. The lateral axis in FIG. 31 represents the relative exposure level while the vertical axis represents the CD value of the image (image width). The exposure margin defined by the expression (ΔCD(%)/ΔExp.(%)) as shown in FIG. 31 is 1.5 for the two value mask and is 1.2 for the attenuating phase shift mask. Though, either of the exposure margins can withstand in a practical use, it is obvious that the attenuating phase shift mask is more improved in the exposure margin.

Here, ΔCD(%) in the above expression represents the amount of fluctuation of the CD value while ΔExp.(%) represents the amount of fluctuation of the exposure level.

Figure 32:
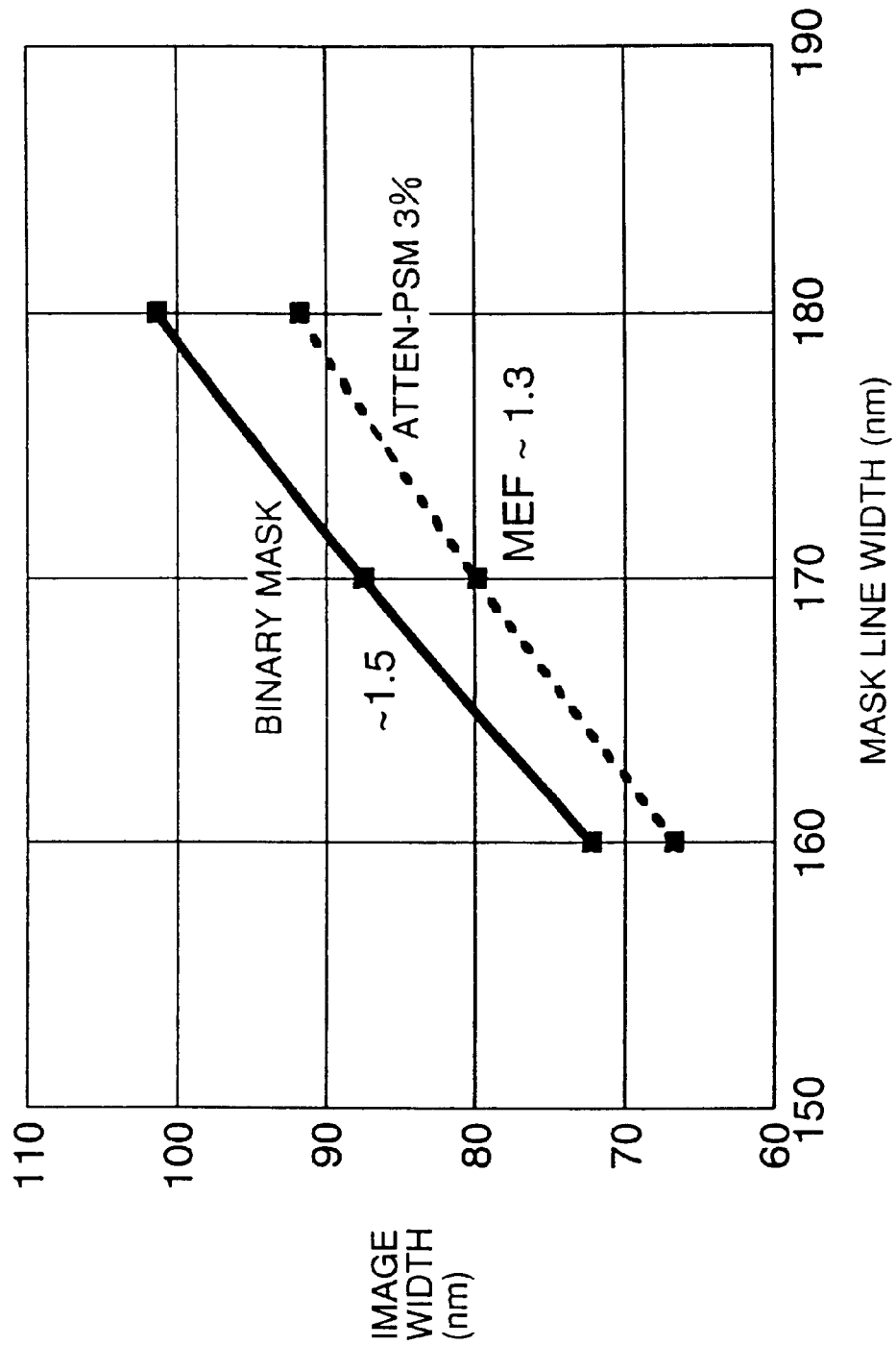
FIG. 32 is a diagram showing the relationship between the image width and the line width of the mask in a two value mask and an attenuating phase shift mask.

The appearance of the change of the CD value according to the change of the mask dimension (mask line width) in the two value mask which is used in the first embodiment and in the attenuating phase shift mask of the present embodiment is shown in FIG. 32. Referring to FIG. 32, the MEF (mask error enhancement factor) becomes larger in a microscopic photolithography, which becomes a large technological barrier (uniformity of the dimension of masks becomes severe). However, according to the technology of the present application, the MEF is smaller than that in other technologies such as up to 1.5 in the case of the two value mask and up to 1.3 in the case of the attenuating phase shift mask. Here, an ordinary MEF is 10 or more.

Figure 33:
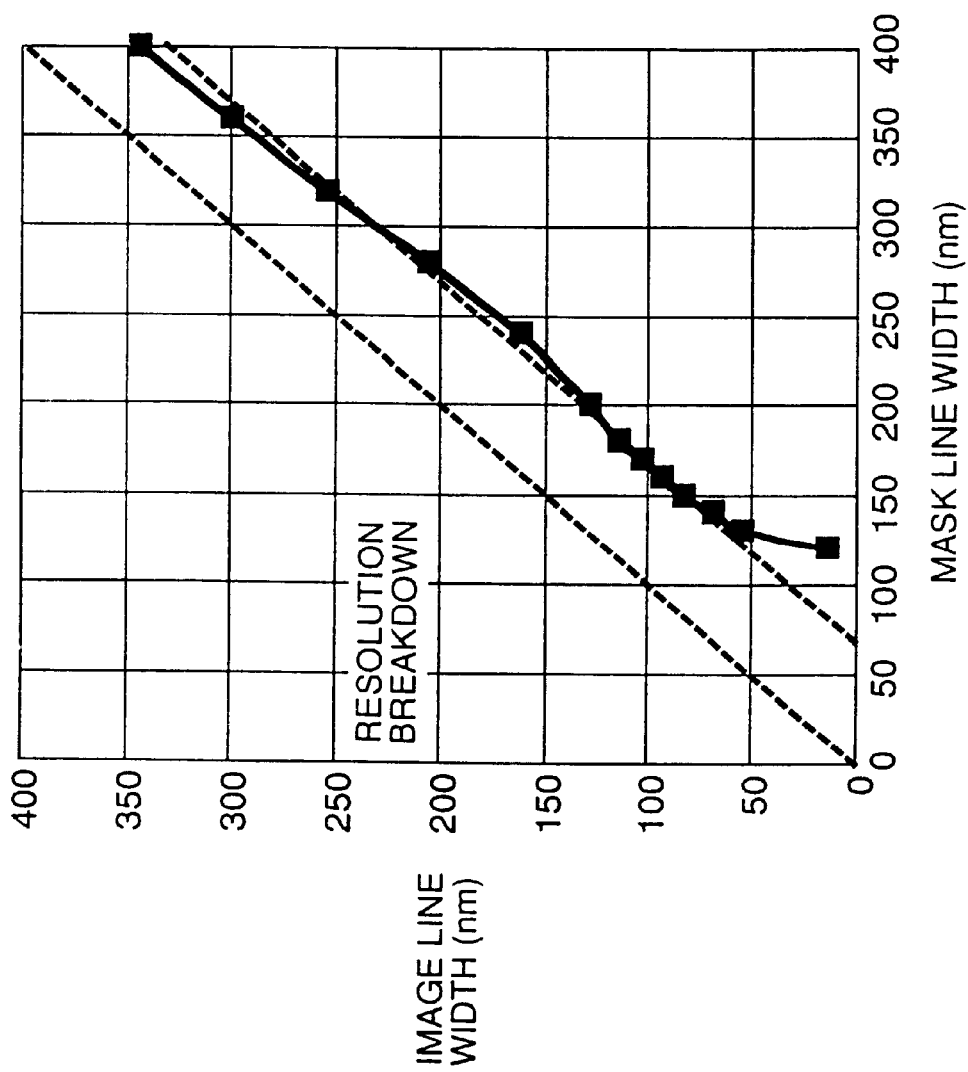
FIG. 33 is a diagram showing the relationship between the line width of the dark line image and the line width of the mask when the exposure is carried out by using a photo mask according to the third embodiment of the present invention.

FIG. 33 shows a change of the line width in the dark line image between a pair of the aperture patterns 2a for light transmission in response to and according to the change of the mask dimension where only the gap W2 between a pair of the aperture patterns 2a for light transmission is changed and the other dimensions are maintained at a constant as shown in FIGS. 1 and 2. Referring to FIG. 33, according to the technology of the present embodiment, the line width of the dark line image is proportional to the line width of the mask up to 80 nm. According to a conventional method, the line width of the image is not proportional to the line width of the mask when the line width becomes 200 nm and, therefore, it is understood that the technology of the present embodiment is much more appropriate for miniaturization than the conventional method.

The technology of the present embodiment and the case where a Levenson type phase shift mask (alternating phase shift mask: Alt-PSM) is used are compared with respect to the deterioration of the CD-Focus characteristics due to the lens aberration.

Figure 34:
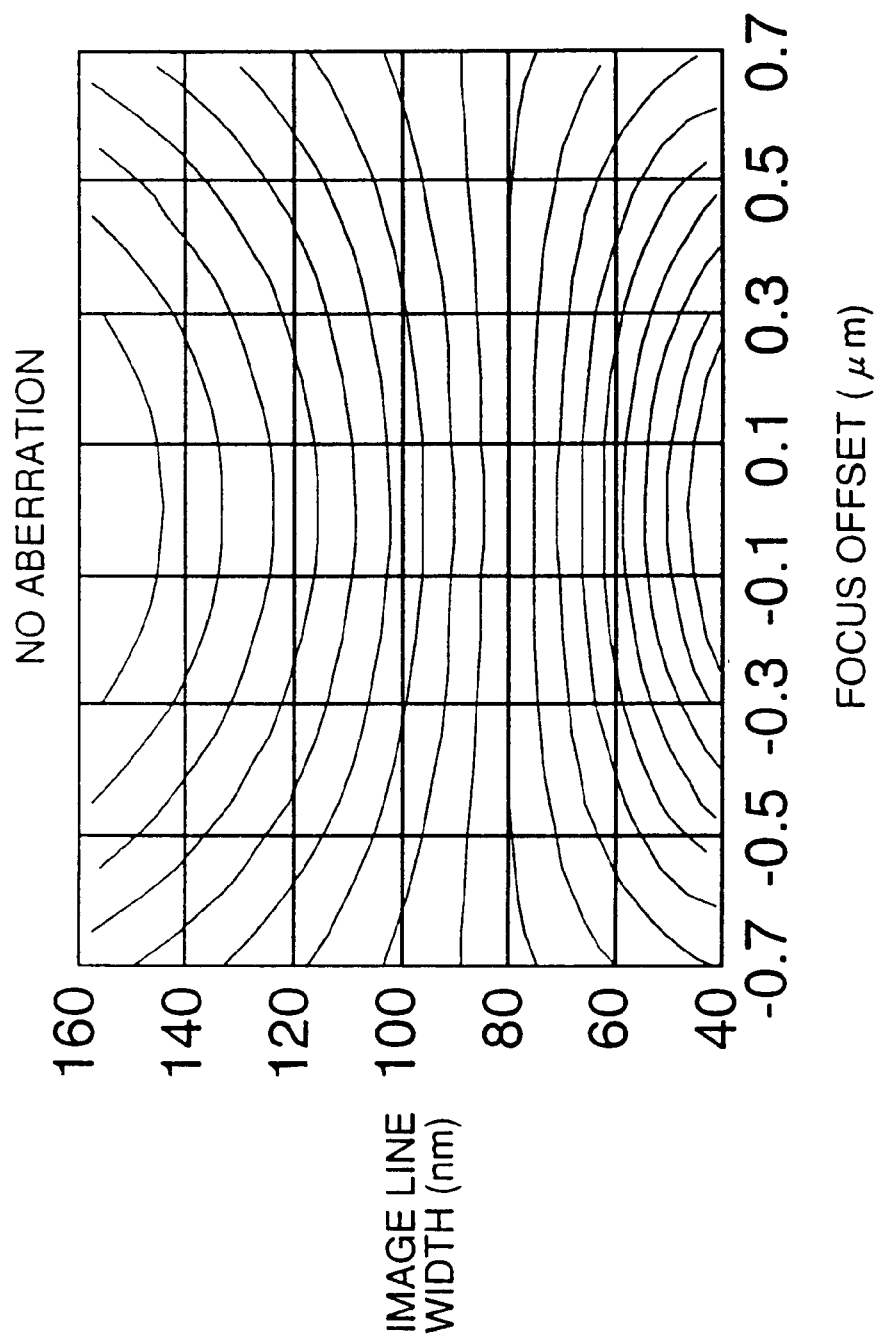
FIG. 34 is a diagram showing the line width of an image and the focus offset when the exposure is carried out by using a photo mask according to the third embodiment of the present invention in the case that no lens aberration exists.
Figure 35:
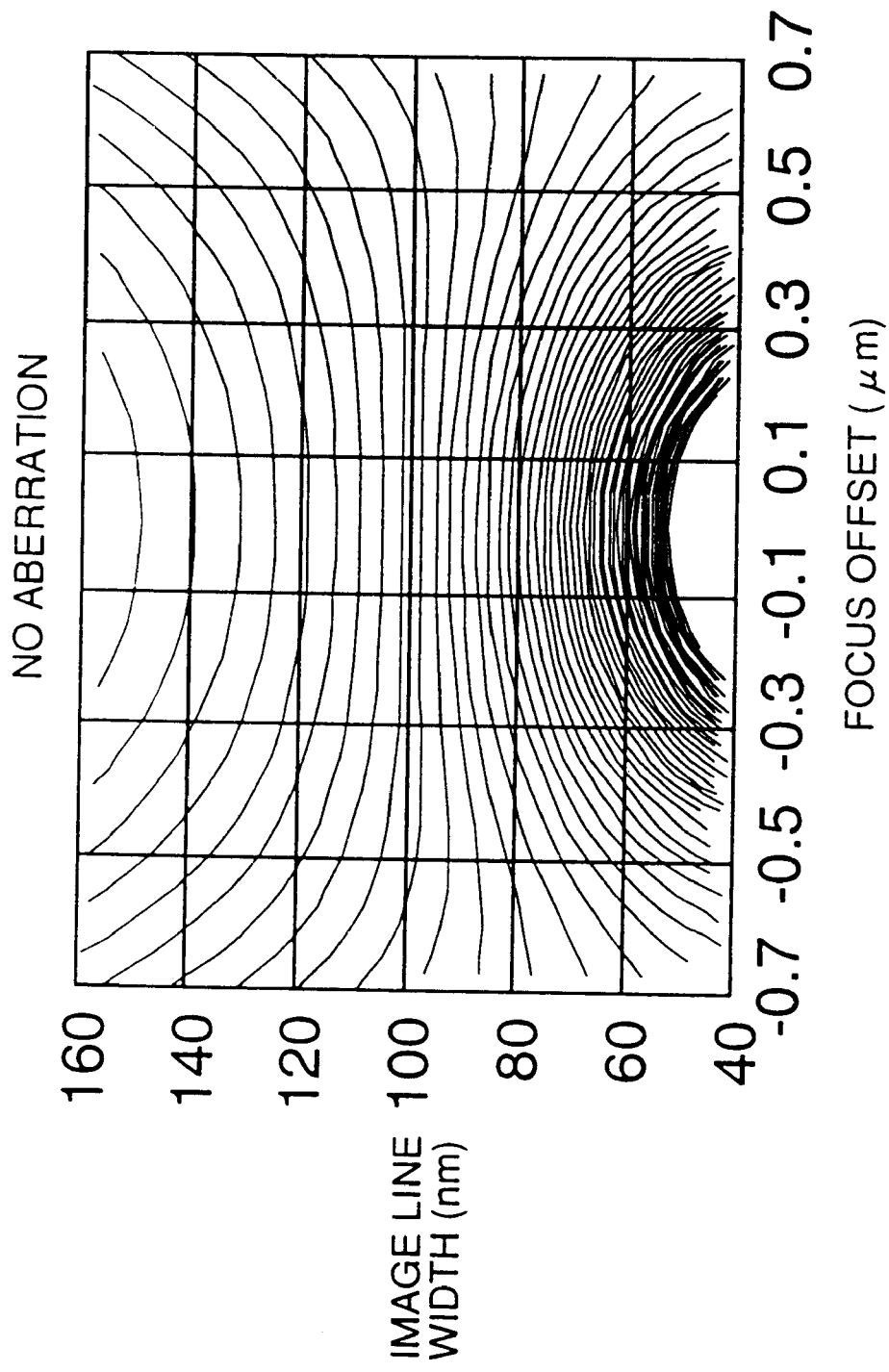
FIG. 35 is a diagram showing the relationship between the line width of an image and the focus offset when the exposure is carried out by using the Levenson type phase shift mask in the case that no lens aberration exists.
Figure 36:
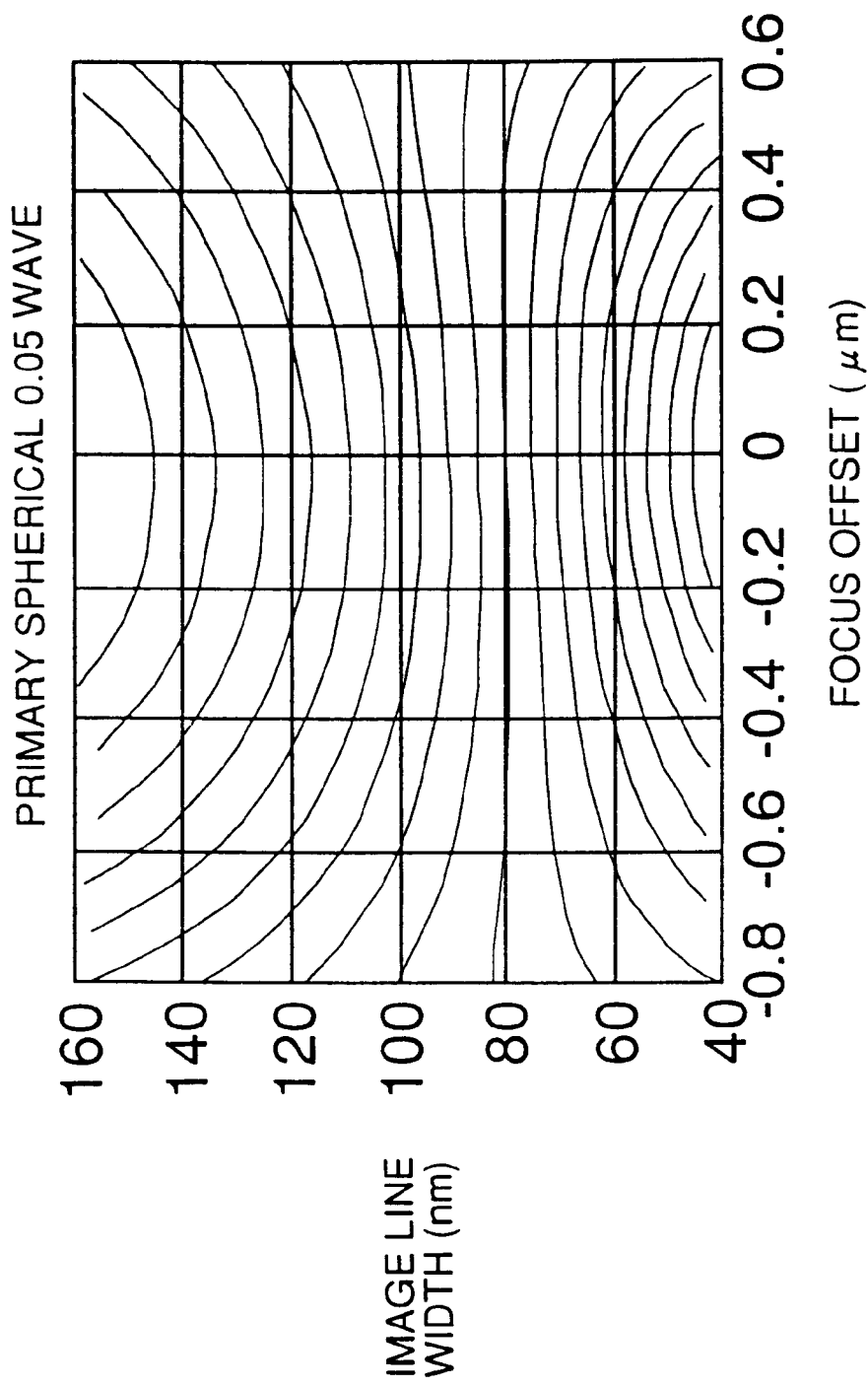
FIG. 36 is a diagram showing the relationship between the line width of an image and the focus offset when the exposure is carried out by using a photo mask according to the third embodiment in the case that a lens aberration exists.
Figure 37:
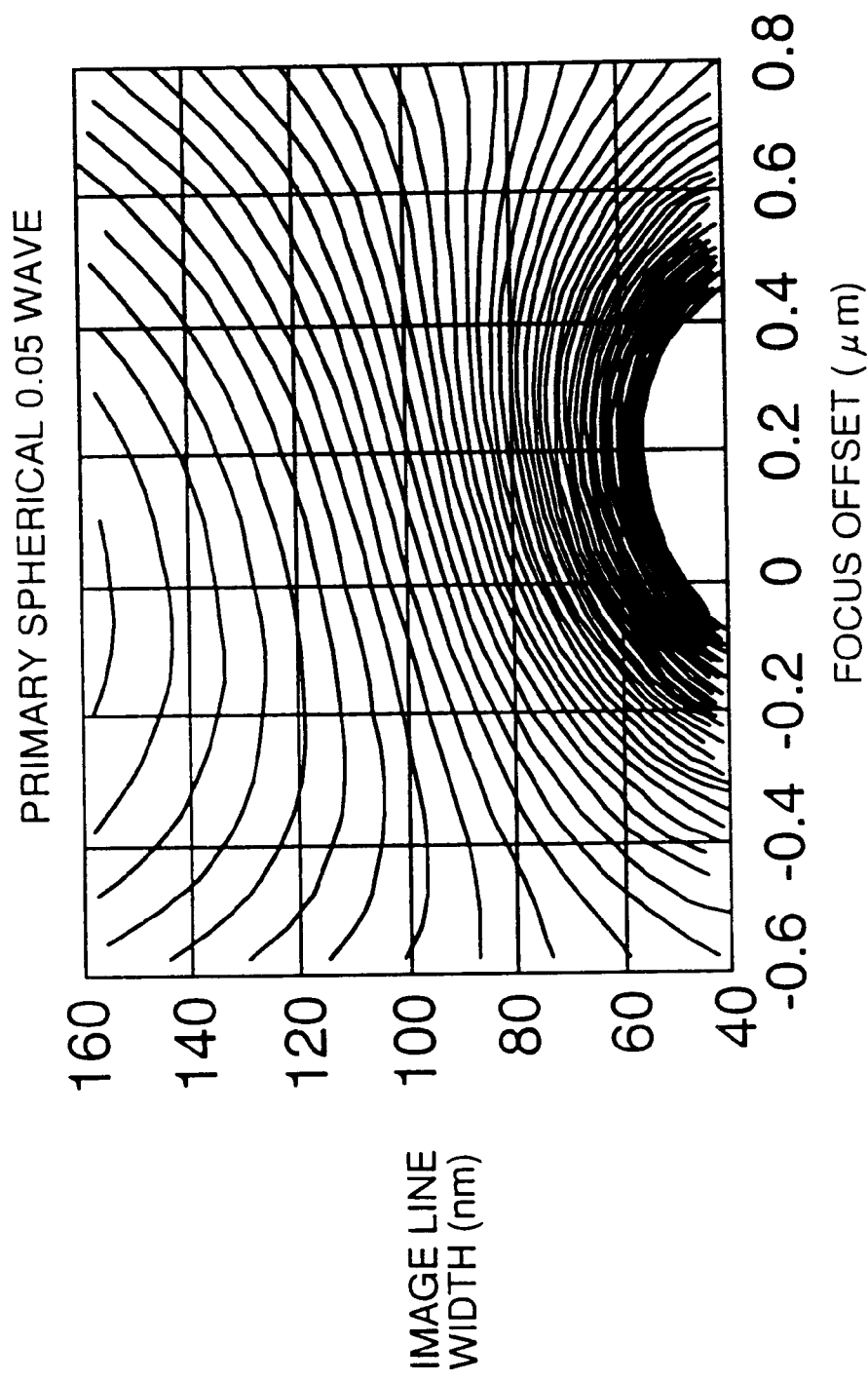
FIG. 37 is a diagram showing the relationship between the line width of an image and the focus offset when the exposure is carried out by using the Levenson type phase shift mask in the case that a lens aberration exists.

FIGS. 34 and 35 show the CD-Focus characteristics in the technology of the present embodiment and in the case where a Levenson type phase shift mask is used in the case that there is no lens aberration. In addition, FIGS. 36 and 37 show the CD-Focus characteristics in the technology of the present embodiment and in the case where a Levenson type phase shift mask is used in the case that there is a lens aberration. Here, the aberration is a low dimensional spherical surface and the size of 0.05λ is assumed.

From FIGS. 35 and 37, it is understood that the case where a Levenson type phase shift mask is used shows the characteristics where the line width of the image remarkably fluctuates according to the fluctuation of the focus due to the aberration so that the CD-Focus characteristics are greatly deteriorated. On the contrary, from FIGS. 34 and 36, it is understood that the line width of the image has a small fluctuation amount according to the fluctuation of the focus even in the case that the lens aberration exists so that there is little deterioration of the CD-Focus characteristics.

(Fourth Embodiment)

In the present embodiment, a method for forming the actual pattern by overexposing the photo mask 5 in FIGS. 1 and 2 is described.

Figure 38:
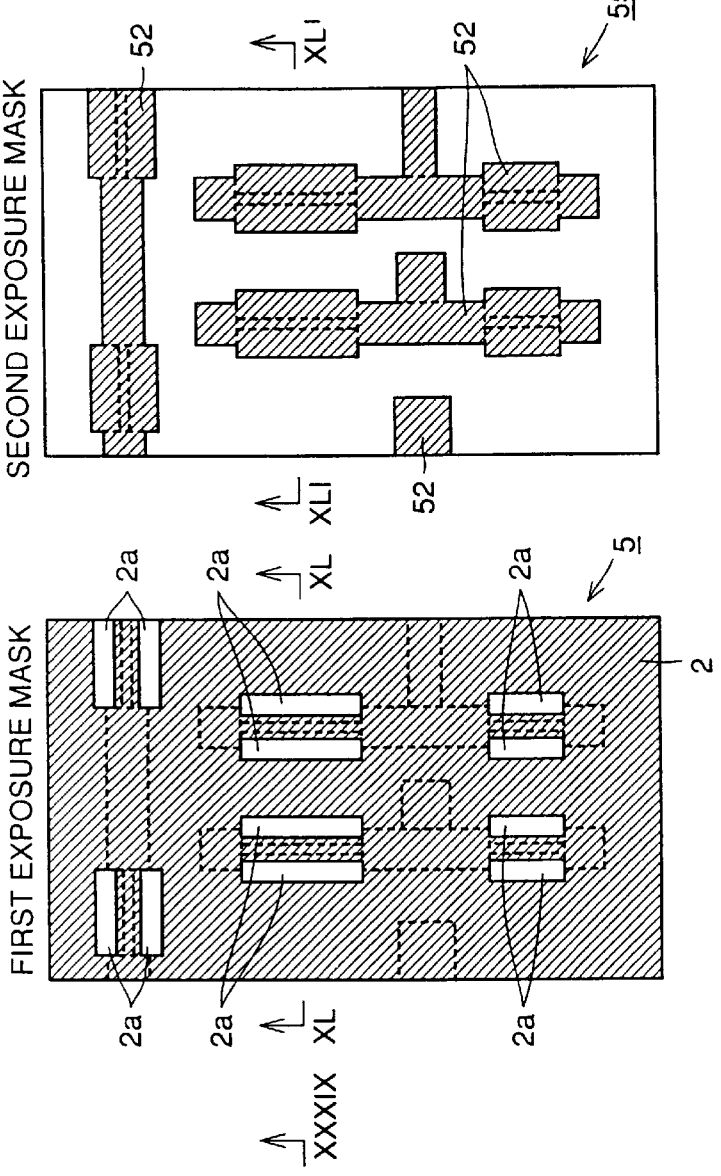
FIG. 38A is a plan view showing a gate pattern of an SRAM.
FIG. 38B is plan view of the first photo mask.
FIG. 38C is a plan view of the second photo mask.

FIG. 38A shows a gate pattern of each transistor which forms a memory cell of a SRAM (static random access memory). And FIGS. 38B and 38C show patterns of the first and the second photo masks which are used to form the pattern of FIG. 38A.

First, a method for designing the patterns of the first and the second photo masks 5 and 55 as shown in FIGS. 38B and 38C is described.

Only the microscopic line parts are extracted from a design pattern as shown in FIG. 38A. The line width of this extracted microscopic line parts is enlarged. At this time, a dimension of 0.35<W1/(λ/NA)<0.65 is added to both size of the microscopic line parts so as to be enlarged. A dimension W2, which satisfies the relationship of 0.35<W2/(λ/NA), is subtracted from the center part of the pattern having the above enlarged line width and thereby a pair of aperture patterns 2a for light transmission is designed as shown in FIG. 38B.

Figure 40:
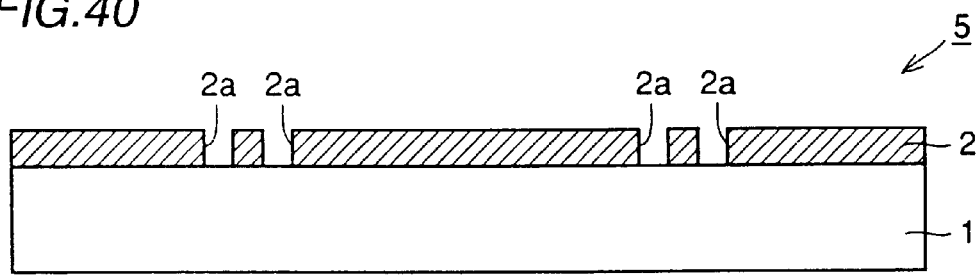
FIG. 40 is a schematic cross section view along the line XL—XL in FIG. 38B.

Therefore, the first photo mask 5 has a structure where a shielding film (or semi-transmissive shielding film) 2 which has plural pairs of aperture patterns 2a for light transmission is formed on a transparent substrate 1 as shown in FIG. 40.

In addition, by adding a pattern of pairs of lines of the line width W1 which satisfies the above described relationship of 0.35<W1/($\lambda$/NA)<0.65 on the design pattern as shown in FIG. 38A, a shielding pattern 52 as shown in FIG. 38C is designed.

Figure 41:
FIG. 41 is a schematic cross section view along the line XLI—XLI in FIG. 38C.

Thereby, the second photo mask 55 has a structure where the shielding film 52 which constructs the above described shielding pattern as shown in FIG. 41 is formed on the transparent substrate 51.

Next, a method for a gate pattern formation by using those first and second photo masks 5 and 55 is described.

Figure 42:
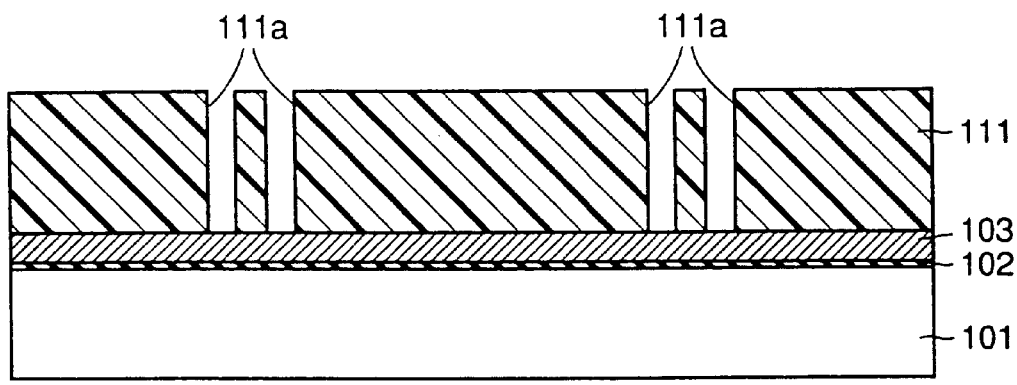
FIGS. 42 to 46 are schematic cross section views showing the steps, in sequence, of a method for a pattern formation using a photo mask according to the fourth embodiment of the present invention.

Referring to FIG. 42, an insulating layer 102 which becomes a gate insulating film is formed on a semiconductor substrate 101 which is made of silicon or the like. A conductive layer 103 which becomes a gate electrode is formed on this insulating layer 102. A positive type photoresist 111, for example, is applied to this conductive layer 103. Here, the insulating layer 102 is made of, for example, a silicon oxidation film and the conductive layer 103 is made of, for example, a polycrystal silicon film to which an impurity is doped.

This photoresist 111 is developed after the application of the first exposure using the first photo mask 5 as shown in FIG. 38B. At the time of this first exposure, the exposure is carried out by an overexposure of which the exposure amount is larger than that of an ordinary exposure. In this overexposure, the exposure amount when the photoresist 111 is exposed as described in the first embodiment, that is, an exposure energy to the pattern which has sufficiently large transmission apertures, is four or more and twenty or less times as large as the exposure energy on the border where the photoresist 111 converts from insoluble to soluble in the developer by the exposure.

Thereby, microscopic aperture patterns 111a which correspond to pairs of aperture patterns for light transmission are formed in the photoresist 111.

Figure 43:
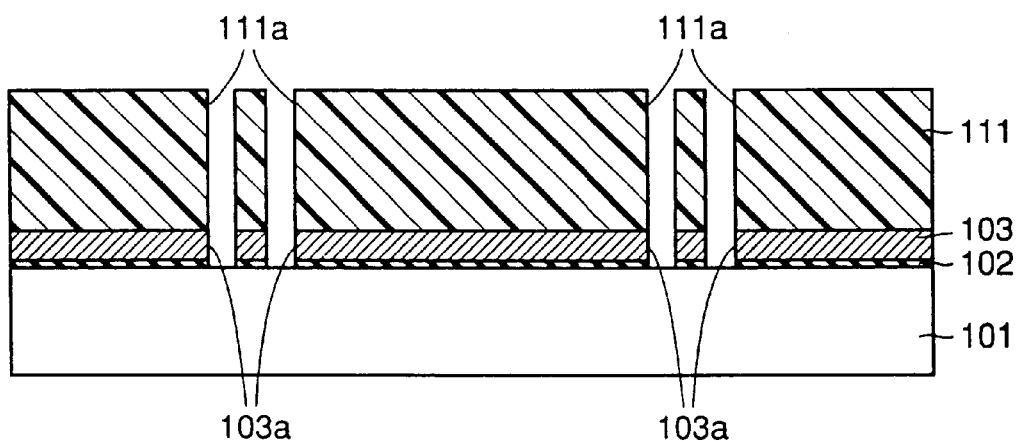

Referring to FIG. 43, having the patterned photoresist 111 as a mask, the conductive layer 103 and the insulating layer 102 below the mask are etched in sequence so as to form an aperture pattern 103a. After that, the photoresist 111 is removed through, for example, ashing.

Figure 44:
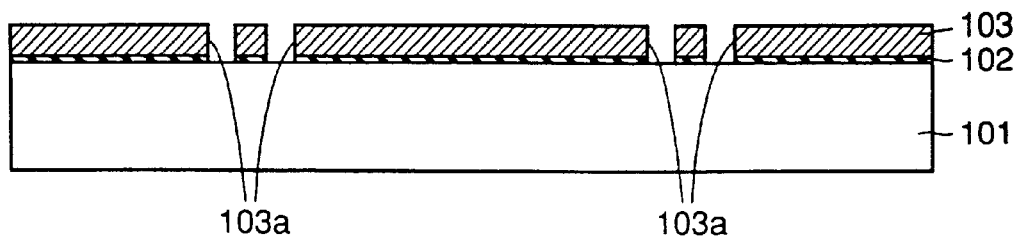

Referring to FIG. 44, the upper surface of the conductive layer 103 is exposed through the above ashing or the like.

Figure 45:
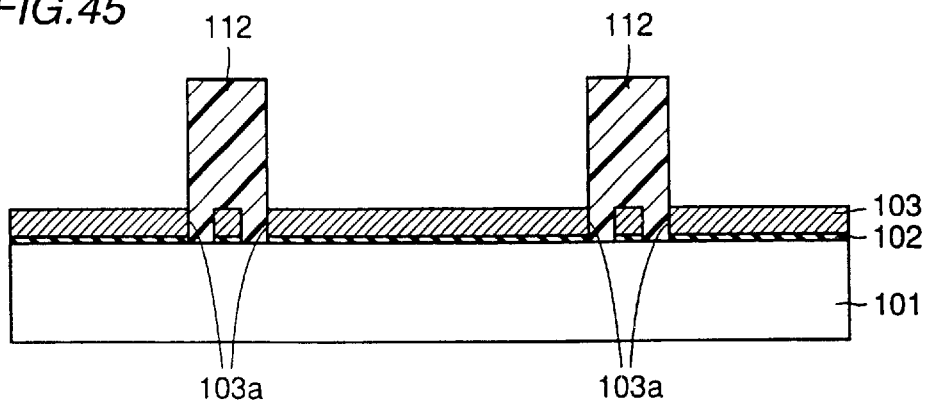

Referring to FIG. 45, after a positive type photoresist 112, for example, is applied to the entire surface, the photoresist 112 is developed after the application of the second exposure using the second photo mask 55 as shown in FIG. 38C. Thereby, the photoresist 112 remains so as to cover the pairs of aperture patterns 103a and the parts sandwiched between them. Having the patterns of this photoresist 112 as a mask, the conductive layer 103 and the insulating layer 102 are removed.

Figure 39:
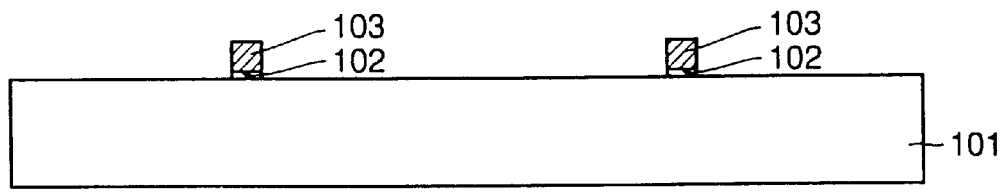
FIG. 39 is a schematic cross section view along the line XXXIX—XXXIX in FIG. 38A.
Figure 46:
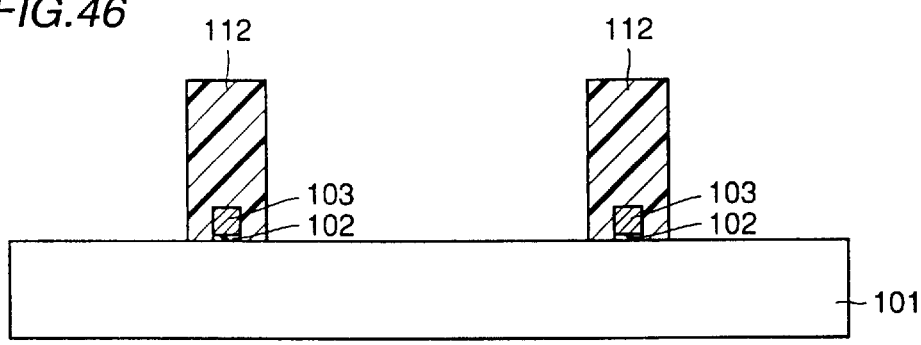

Referring to FIG. 46, in regions where the patterns of the photoresist 112 are not formed by the above step, the surface of the semiconductor substrate 101 is exposed. After that, the patterns of the photoresist 112 are removed through ashing or the like so that the gate pattern including the conductive layer 103 is formed as shown in FIGS. 38A and 39.

Here, the above described first exposure may be carried out a plurality of times before the photoresist 111 is developed. The above described second exposure may also be carried out a plurality of times before the photoresist 112 is developed.

In addition, though the case where the patterns of the photoresist are used to directly pattern the conductive layer which becomes the gate pattern is described in the above, a hard mask may be used to pattern the conductive layer which becomes the gate pattern.

Figure 47:
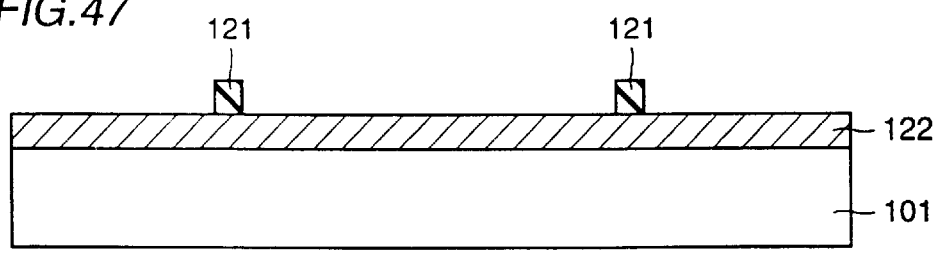
FIGS. 47 and 48 are schematic cross section views showing the steps, in sequence, of a method for a pattern formation using a hard mask.

First, according to a method of the above described FIGS. 42 to 46, a hard mask pattern 121 is formed instead of the gate pattern as shown in FIG. 47. This hard mask pattern 121 is used as a mask to etch the conductive layer 122 which is beneath the mask and becomes the gate electrode.

Figure 48:
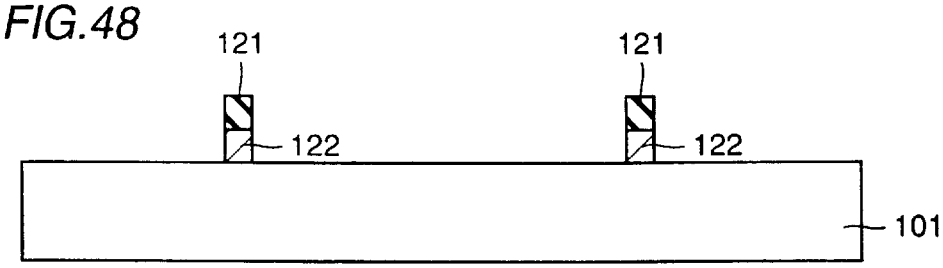

Referring to FIG. 48, through this etching the conductive layer 122 is patterned so as to form the gate pattern.

Here, the insulating layer which becomes a gate insulating layer beneath the conductive layer 122 which becomes the gate pattern is omitted for the convenience in description.

The embodiments disclosed here should be considered to be exemplary in all respects and not to be limitative. The scope of the present invention is not defined by the above description but, rather, is defined by the scope of the claims and the equivalent meaning in the claims and all modifications within the scope of the claims are intended to be included in the scope of the claims.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photo mask comprising:

a substrate having a main surface; and a shielding film which is formed on the main surface of said substrate and which has a pair of aperture patterns for light transmission with substantially the same line width and running parallel to each other with a gap and isolated from other aperture patterns for light transmission, wherein each of W1, W2 and W3 satisfies the relationships of 0.54<W2/W1 and 1.08<W3/W1 when the line width of said pair of aperture patterns for light transmission is denoted as W1, the gap between said pair of aperture patterns for light transmission is denoted as W2 and a minimum gap between said pair of aperture patterns for light transmission and said other aperture patterns for light transmission is denoted as W3.

* * * * *